US006868134B2

(12) United States Patent
Yoshizaki

(10) Patent No.: US 6,868,134 B2
(45) Date of Patent: Mar. 15, 2005

(54) METHOD AND APPARATUS FOR RECOVERING A CLOCK SIGNAL FROM AN ASYNCHRONOUS DATA SIGNAL

(75) Inventor: Shoichi Yoshizaki, Sunnyvale, CA (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 621 days.

(21) Appl. No.: 09/917,238

(22) Filed: Jul. 30, 2001

(65) Prior Publication Data
US 2003/0021368 A1 Jan. 30, 2003

(51) Int. Cl.[7] .............................................. H04L 7/00
(52) U.S. Cl. ..................................... 375/354; 375/370
(58) Field of Search ................................ 375/354, 326, 375/375, 370; 327/208, 210, 272, 278

(56) References Cited

U.S. PATENT DOCUMENTS

| 5,245,637 | A | | 9/1993 | Gersbach et al. | |
|---|---|---|---|---|---|
| 5,596,610 | A | * | 1/1997 | Leung et al. | 375/376 |
| 5,822,530 | A | | 10/1998 | Brown | |
| 6,178,207 | B1 | * | 1/2001 | Richards et al. | 375/259 |
| 2003/0038681 | A1 | * | 2/2003 | Djafari et al. | 331/1 A |

FOREIGN PATENT DOCUMENTS

WO 99/60784 A1 11/1999

* cited by examiner

Primary Examiner—Khai Tran

(74) Attorney, Agent, or Firm—McDermott Will & Emery LLP

(57) ABSTRACT

A clock recovery unit for generating a clock signal corresponding to an asynchronous data signal. The clock recovery unit includes an input port for receiving an incoming data signal; a local oscillator circuit for generating a plurality of clock signals having the same frequency, where the plurality of clock signals are each shifted in phase relative to one another; a sampling unit having a plurality of latches, each of which is clocked by one of the plurality of clock signals generated by the local oscillator circuit, the sampling unit outputting a plurality data samples of the incoming data signal; a data phase alignment unit coupled to the sampling unit, the data phase alignment unit receiving the plurality of data samples as input signals and operative for shifting the phase of the plurality of data samples; a multiplexer circuit coupled to the data phase alignment unit, the multiplexer circuit having a first multiplexer operative for selecting a portion of the plurality of data samples, each of the data samples having a corresponding clock signal, which is one of the plurality of clock signals generated by the local oscillator circuit, the multiplexer circuit having a second multiplexer operative for selecting one of the plurality of clock signals generated by the local oscillator circuit; a phase decoder coupled to the multiplexer circuit, the phase decoder operative for receiving the portion of the plurality of data samples selected by the multiplexer and for generating an output signal indicative of the logic values of the portion of the plurality of the data samples selected by the first multiplexer; and a barrel shifter circuit coupled to the phase decoder, the barrel shifter operative for adjusting the data samples selected by the first multiplexer in accordance with the output signal of the phase decoder.

36 Claims, 40 Drawing Sheets

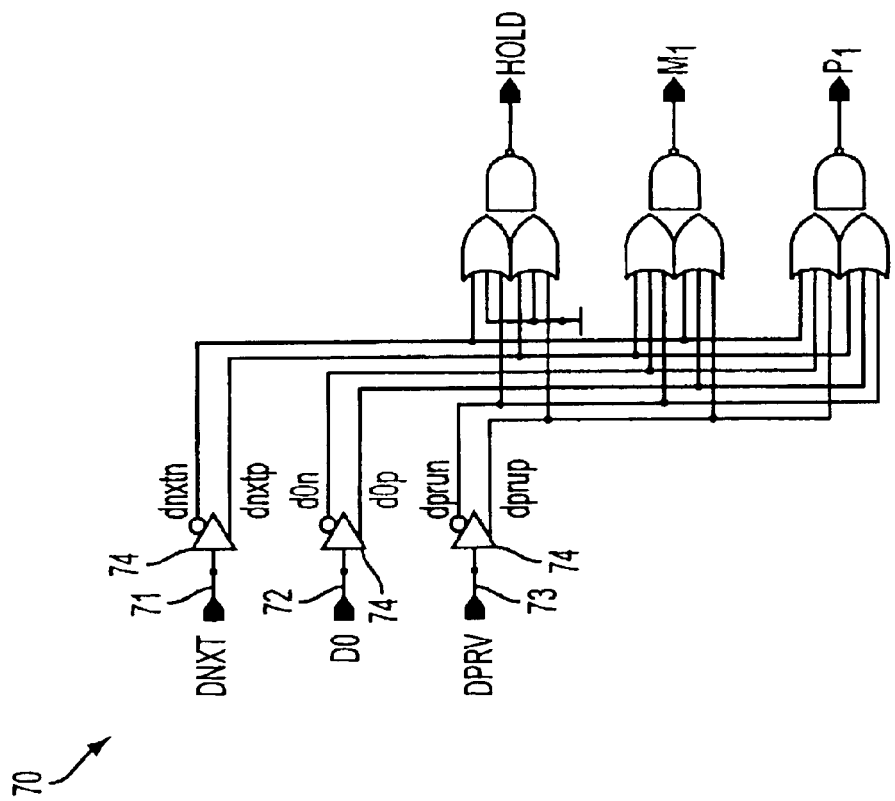

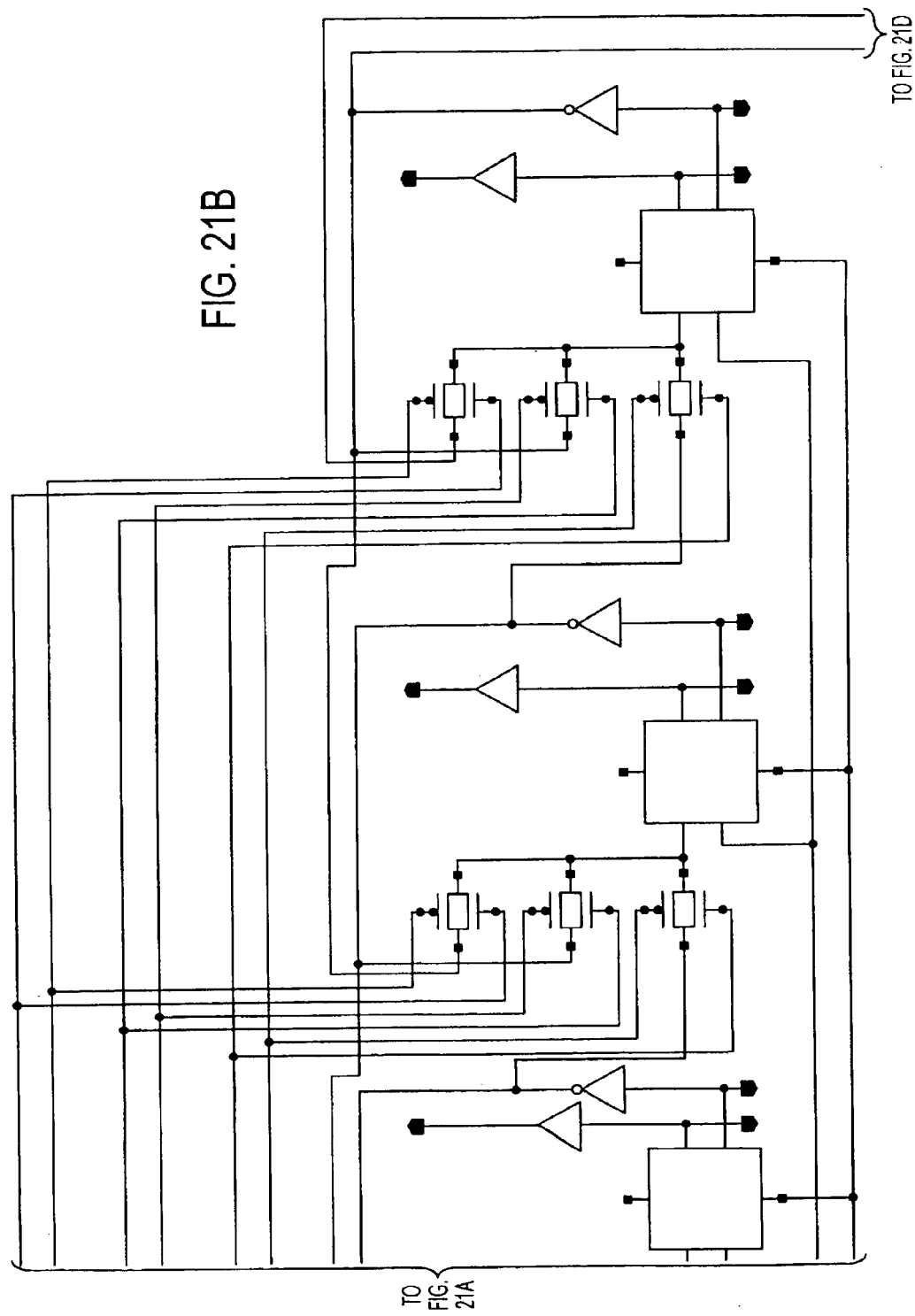

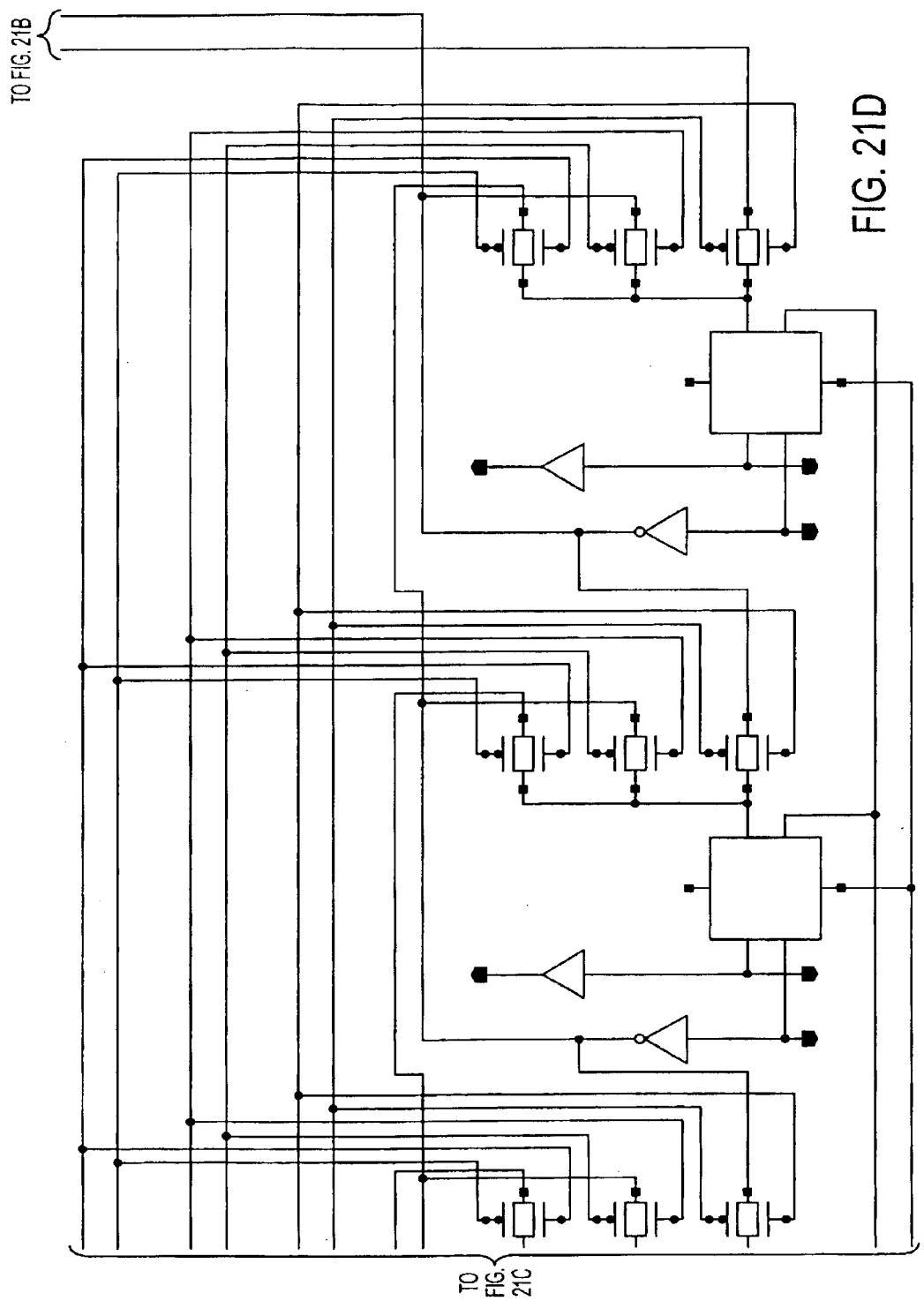

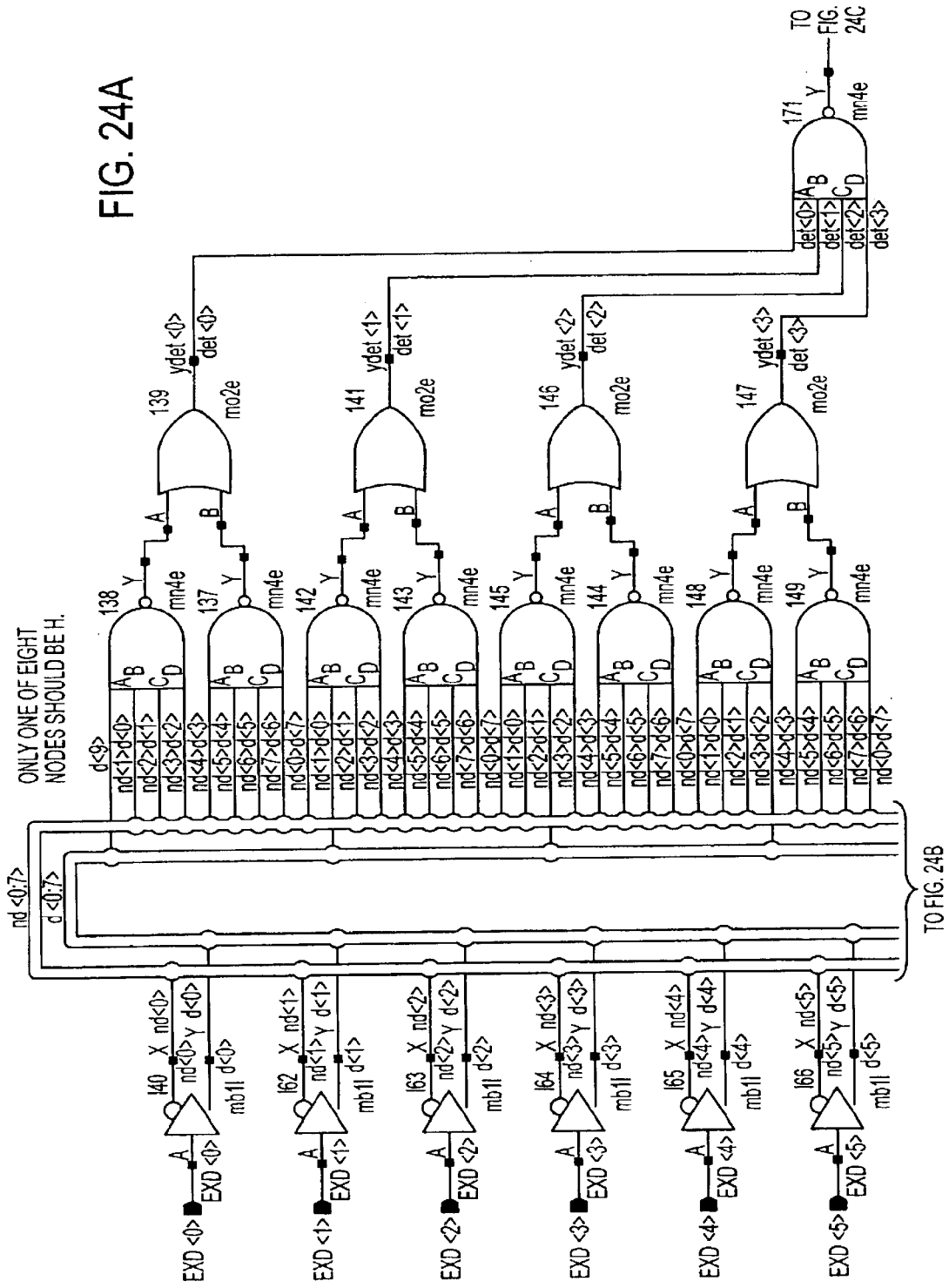

METHOD AND APPARATUS FOR RECOVERING A CLOCK SIGNAL FROM AN ASYNCHRONOUS DATA SIGNAL

FIELD OF THE INVENTION

The present invention relates to systems and methods for the recovery of asynchronous digital data by a receiver, and more particularly to an apparatus and method for generating a clock signal corresponding to the asynchronous digital data signal.

BACKGROUND OF THE INVENTION

In digital data transmission systems operating in an asynchronous data transfer mode, digital data is output by a transmission unit as an asynchronous serial data signal, without an clock signal embedded therein. Upon reception of the asynchronous serial data signal, the receiver must function to recover the data transmitted by the transmission unit, and to generate a clock signal corresponding to the received data. Importantly, both the generated clock signal and the data must be synchronous (i.e., phase aligned) with one another so as to allow the receiver to properly process the received data.

FIG. 1 illustrates an example of a prior art clock and data regeneration portion of a receiver circuit. As shown, the receiver 10 has a cable 8 coupled to the input thereof. Cable 8 functions to couple the asynchronous data signal to the receiver. The clock and data regeneration portion 12 of the receiver comprises a clock recovery unit 13 and a sampling gate 14, which, for example, can comprise a latch or flip-flop. In operation, the incoming serial data signal is coupled to the clock recovery unit 13, which functions to reproduce a clock signal corresponding to the received data signal. The output of the clock recovery unit 13 is coupled to a clock input of the sampling gate 14, and is utilized to clock the sampling gate 14. As such, the output of the sampling latch 14 and the clock recovery unit 13 represent the incoming data signal and corresponding clock signal phase aligned with one another. These two signals, which represent the output of the clock and data regeneration portion 12 of the receiver, are coupled to the main portion of the receiver for processing.

FIG. 2 illustrates an example of one known clock recovery unit 16. As shown, the clock recovery unit comprises a phase detector 17, a charge pump 18, a low pass filter 19 and a voltage controller oscillator ("VCO") 20 all coupled in series. In operation, the phase detector 17 receives both the incoming serial data signal and the output of the VCO 20 as input signals, and detects the phase difference between these two signals. The phase difference output by the phase detector 17 is then utilized to control the voltage level output by the charge pump 18 so as to adjust the frequency of the signal output by the VCO 20 to eliminate the phase difference between the VCO 20 and the incoming serial data signal. Accordingly, the output of the VCO 20 is continuously tracking the incoming serial data signal and represents the recovered clock signal.

However, as the clock recovery unit 16 is essentially a phase-lock loop, it takes approximately 1:sec. or more to synchronize the clock signal to the data signal having a frequency of, for example, that utilized by the USB 2.0 standard. During this "synchronization" period incoming data cannot be recovered, and therefore the data is lost.

Another method of recovering the clock signal corresponding to the incoming asynchronous data signal is to over-sample the incoming data signal. For example, 4× oversampling can be utilized to recover the corresponding clock signal. However, while such an approach is acceptable for low frequency signals, it is not a practical solution for high frequency signals (e.g., 500 Mbit/sec. signal). In particular, it is not practical to implement a clock having the necessary 4× frequency in an IC. Moreover, such a high frequency clock source introduces undesirable noise problems into the circuit.

Accordingly, there is exists a need for a method and a system for generating a clock signal corresponding to an asynchronous data signal that solves the foregoing problems. More specifically, a method and a system that allows for fast synchronization of the incoming data signal and clock signal so as to minimize the loss of incoming data, and that does not require a sampling source having a frequency rate greater than that of the incoming data signal.

SUMMARY OF THE INVENTION

In an effort to solve the aforementioned needs, it is an object of the present invention to provide a simple, cost effective design for producing a clock signal corresponding to an asynchronous data signal that provides for minimal data loss prior to synchronization between the clock signal and the incoming data signal, and that does require a sampling source having a frequency rate greater than the incoming data signal.

More specifically, the present invention relates to a clock recovery unit for generating a clock signal corresponding to an asynchronous data signal. The clock recovery unit includes an input port for receiving an incoming data signal; a local oscillator circuit for generating a plurality of clock signals having the same frequency, where the plurality of clock signals are each shifted in phase relative to one another; a sampling unit having a plurality of latches, each of which is clocked by one of the plurality of clock signals generated by the local oscillator circuit, the sampling unit outputting a plurality data samples of the incoming data signal; a data phase alignment unit coupled to the sampling unit, the data phase alignment unit receiving the plurality of data samples as input signals and operative for shifting the phase of the plurality of data samples; a multiplexer circuit coupled to the data phase alignment unit, the multiplexer circuit having a first multiplexer operative for selecting a portion of the plurality of data samples, each of the data samples having a corresponding clock signal, which is one of the plurality of clock signals generated by the local oscillator circuit, the multiplexer circuit having a second multiplexer operative for selecting one of the plurality of clock signals generated by the local oscillator circuit; a phase decoder coupled to the multiplexer circuit, the phase decoder operative for receiving the portion of the plurality of data samples selected by the multiplexer and for generating an output signal indicative of the logic values of the portion of the plurality of the data samples selected by the first multiplexer; and a barrel shifter circuit coupled to the phase decoder, the barrel shifter operative for adjusting the data samples selected by the first multiplexer in accordance with the output signal of the phase decoder.

As described in further detail below, the present invention provides significant advantages over the prior art. Most importantly, the clock recovery system of the present invention provides a simple and cost effective design for the generation of a clock signal corresponding to an asynchronous data signal that minimizes the amount of data lost during the synchronization process. In other words, the clock signal is synchronized to the incoming data signal in minimal time.

Another advantage is that the system of the present invention does not require the oversampling of the incoming asynchronous data signal. As a result, the present invention eliminates the cost and noise problems associated with the inclusion of an additional oscillator. In addition, as oversampling is not necessary, there are no constraints on the maximum allowable data rate. For example, if 4× oversampling was necessary, the maximum data rate would be ¼ the maximum possible clock rate.

Additional advantages of the present invention will become apparent to those skilled in the art from the following detailed description of exemplary embodiments of the present invention.

The invention itself, together with further objects and advantages, can be better understood by reference to the following detailed description and the accompanying drawings.

BRIEF DESCRIPTION OF THE DRAWINGS

FIG. 5 contains a table illustrating the logical operation preformed by the phase decoder illustrated in FIG. 3a.

FIG. 6 is an exemplary embodiment of the phase decoder illustrated in FIG. 3a.

FIG. 7 illustrates an exemplary embodiment of one of the 4:1 multiplexers contained in the multiplexer circuit illustrated in FIG. 3a.

FIG. 8 illustrates an exemplary embodiment of the barrel shifter illustrated in FIG. 3a.

DETAILED DESCRIPTION OF THE INVENTION

Figure 1:
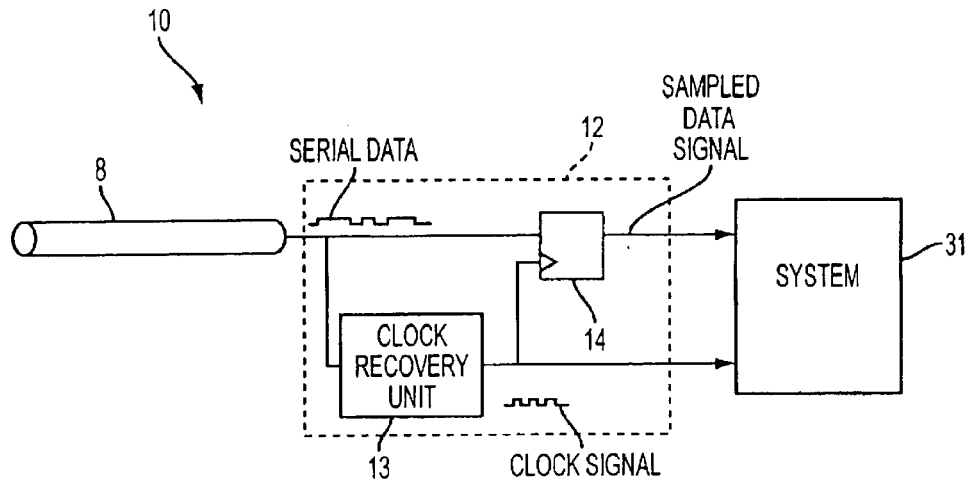
FIG. 1 illustrates an example of a prior art clock and data regeneration portion of a receiver.
Figure 2:
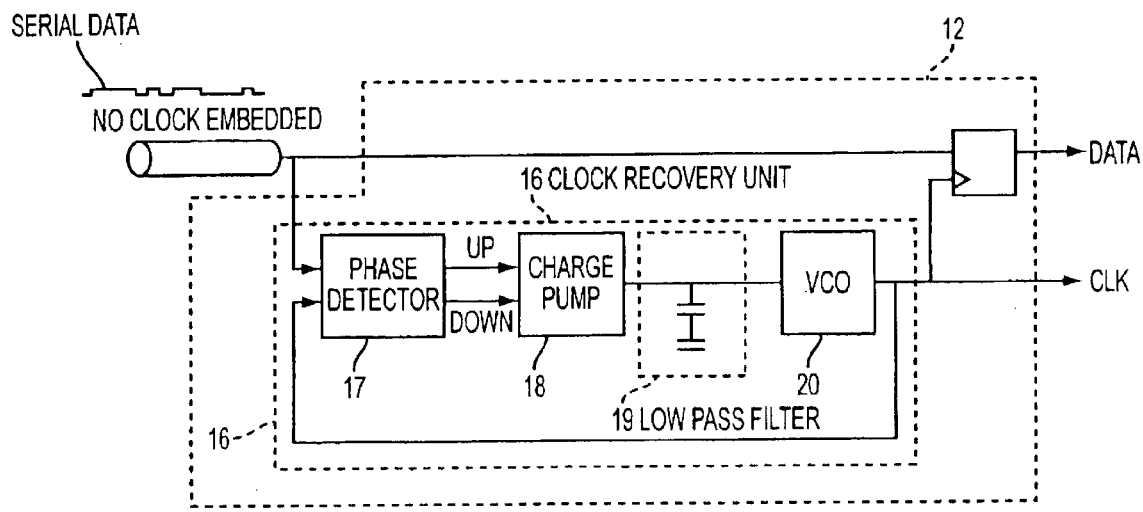
FIG. 2 illustrates an example of a prior art clock recovery unit.
Figure 3A:
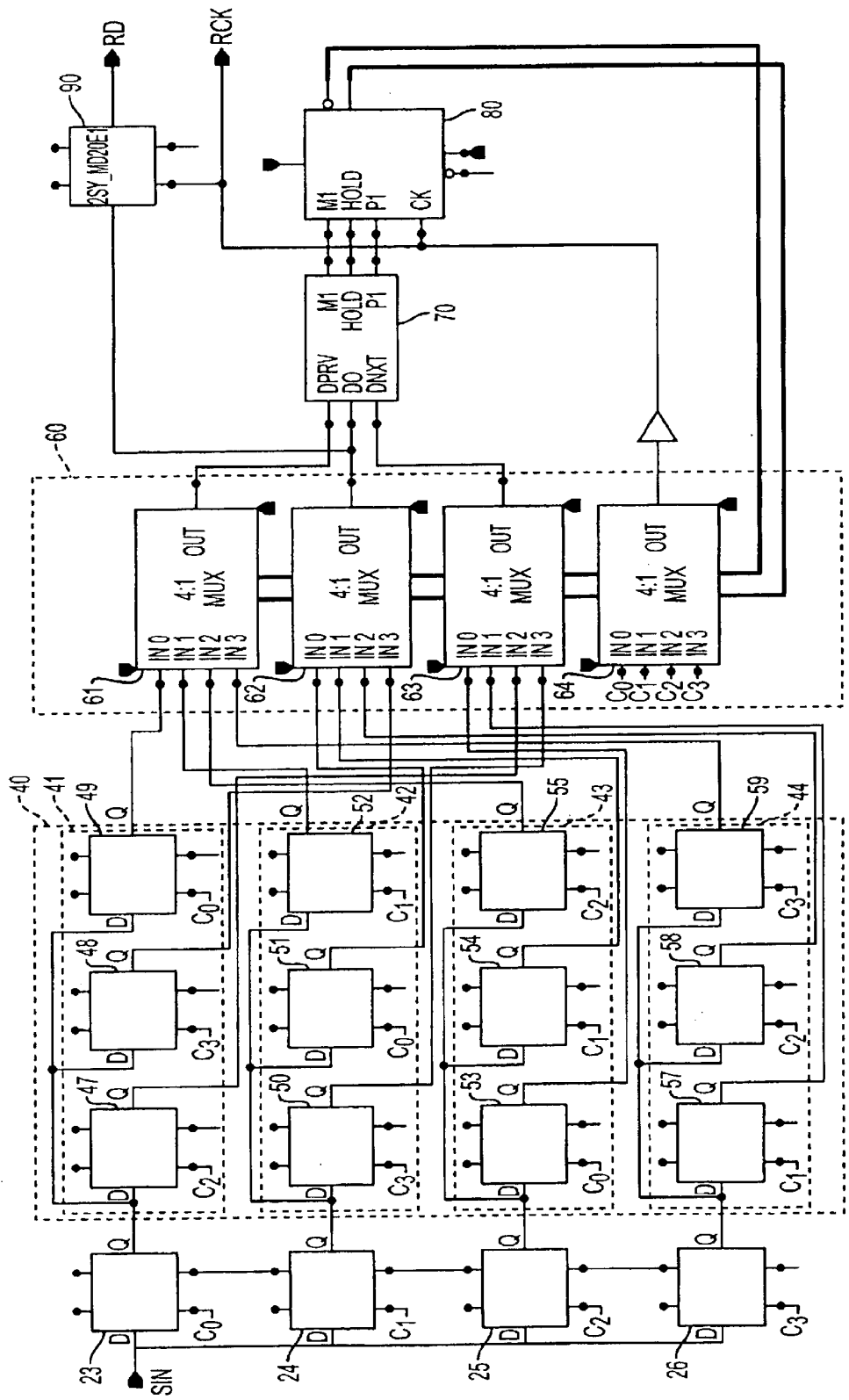
FIG. 3a illustrates an exemplary embodiment of the clock recovery system of the present invention.

FIG. 3a illustrates an exemplary embodiment of the clock recovery system of the present invention. As shown, the system 100 comprises a multi-phase sampling unit 22, which comprises four latches (e.g., d-type flip-flops) 23, 24, 25 and 26. Each of the four latches 23, 24, 25 and 26 receives the incoming asynchronous data signal "SDIN" as an input signal. The four latches 23, 24, 25 and 26 receive clock signals c0, c1, c2 and c3, respectively, as the respective clock signal for gating the latch.

Figure 3B:
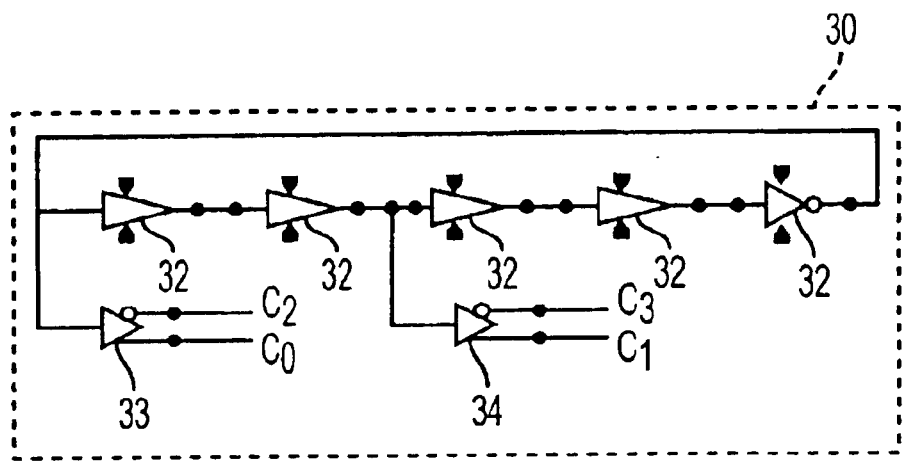
FIG. 3b illustrates an exemplary embodiment of the multi-phase sampling clock circuit utilized in the present invention.

As shown in FIG. 3(b), clock signals c0, c1, c2 and c3 are generated by a four phase VCO circuit 30. The VCO circuit 30 comprises a plurality of delay elements 32 coupled in series and two inverters 33 and 34, each of which have inverted and a non-inverted output. Each of the clock signals c0, c1, c2 and c3 have the same frequency, which is approximately equal to the expected frequency of the incoming asynchronous data signal. However, each clock signal is phase shifted with respect to the other clock signal by 90°. For example, in the current embodiment, c0 is not phase-shifted relative to the main clock of the VCO circuit 30, c1 is phase-shifted 90° relative to c0, c2 is phase-shifted 180° relative to c0, and c3 is phase-shifted 270° relative to c0. Thus, VCO circuit 30 produces four clock signals each having the same frequency, but which are all out of phase with one another by 90°.

Referring again to FIG. 3(a), the clock recovery system 100 further comprises a data phase alignment circuit 40. As shown, the data phase alignment circuit 40 comprises four rows 41, 42, 43 and 44 of latches (e.g., d-type flip-flops), with each row containing three latches. More specifically, the first row of latches 41, referred to as the c0 line, is coupled to the output of gate 23 of the multi-phase sampling unit 22, which is clocked by clock signal c0. As shown, the output of latch 23 is coupled directly to the input of each latch contained in row 41. Accordingly, the output of latch 23 is directly coupled to latches 47, 48 and 49. In addition, latches 47, 48 and 49 are clocked by clock signals c2, c3 and c0, respectively.

Similarly, the second row of latches 42, referred to as the c1 line, is coupled to the output of latch 24 of the multi-phase sampling unit 22, which is clocked by clock signal c1. As shown, the output of latch 24 is coupled directly to the input of each latch contained in row 42. Accordingly, the output of latch 24 is directly coupled to latches 50, 51 and 52. In addition, latches 50, 51 and 52 are clocked by clock signals c3, c2 and c1, respectively.

Continuing, the third row of latches 43, referred to as the c2 line, is coupled to the output of latch 25 of the multi-phase sampling unit 22, which is clocked by clock signal c2. As shown, the output of latch 25 is coupled directly to the input of each latch contained in row 43. Accordingly, the output of latch 25 is directly coupled to latches 53, 54 and 55. In addition, latches 53, 54 and 55 are clocked by clock signals c0, c1 and c2, respectively.

Finally, the fourth row of latches 44, referred to as the c3 line, is coupled to the output of latch 26 of the multi-phase sampling unit 22, which is clocked by clock signal c3. As shown, the output of gate 26 is coupled directly to the input of each latch contained in row 44. Accordingly, the output of gate 26 is directly coupled to flips-flops 57, 58 and 59. In addition, latches 57, 58 and 59 are clocked by clock signals c1, c2 and c3, respectively.

Referring again to FIG. 3a, the system 100 further includes a multiplexer 60 comprising four 4:1 multiplexers 61, 62, 63 and 64. Each of the first three multiplexers 61, 62 and 63 receives one input signal from one of the four rows 41, 42, 43 and 44 of the data phase alignment unit 22. Specifically, the four input lines of multiplexer 61 are coupled to latch 49 of the c0 line, latch 52 of the c1 line, latch 55 of the c2 line, and latch 59 of the c3 line. Similarly, the four input lines of multiplexer 62 are coupled to latch 48 of the c0 line, latch 51 of the c1 line, latch 54 of the c2 line, and latch 58 of the c3 line. Finally, the four input lines of multiplexer 63 are coupled to latch 47 of the c0 line, latch 50 of the c1 line, latch 53 of the c2 line, and latch 57 of the c3 line. Multiplexer 64 receives clock signals c0, c1, c2 and c3 output by the VCO circuit 30 as input signals.

The system of the present invention further comprises a phase decoder circuit 70. As shown in FIG. 3(a), the phase decoder circuit 70 has three input lines, DPRV, D0 and DNXT. The first input line, DPRV, is coupled to the output of multiplexer 61. The second input line, D0, is coupled to output of multiplexer 62. Finally, the third input line, DNXT, is coupled to the output of multiplexer 63. The operation of the phase decoder circuit 70 will be explained in conjunction with the detailed explanation of the operation of the clock recovery system, which is set forth below.

The clock recovery system of the present invention further comprises a barrel shifter 80 which is coupled to the outputs of the phase decoder circuit 70. Specifically, the barrel shifter 80 comprises three input lines, M1, HOLD and P1, which are coupled to three corresponding outputs on the phase decoder circuit 70. The output of the barrel shifter 80 is coupled to each of the multiplexers 61–64 contained in the multiplexer circuit 60. As explained in more detail below, the barrel shifter 80 functions to control each multiplexer 61–64 so as to select which input will be coupled to the phase decoder circuit 70. The barrel shifter 80 also receives the output of multiplexer 64 as a clock signal.

Finally, the clock recovery system further includes an additional latch 90 (e.g., D flip-flop), which has an input signal coupled to the output of multiplexer 62. The latch 90 also receives the clock signal output by multiplexer 64 as an input clock signal. It is noted that the output of latch 90 represents the recovered data signal, and the clock signal output by multiplexer 64 represents the regenerated clock signal, which is synchronized with the recovered data signal.

Figure 4:
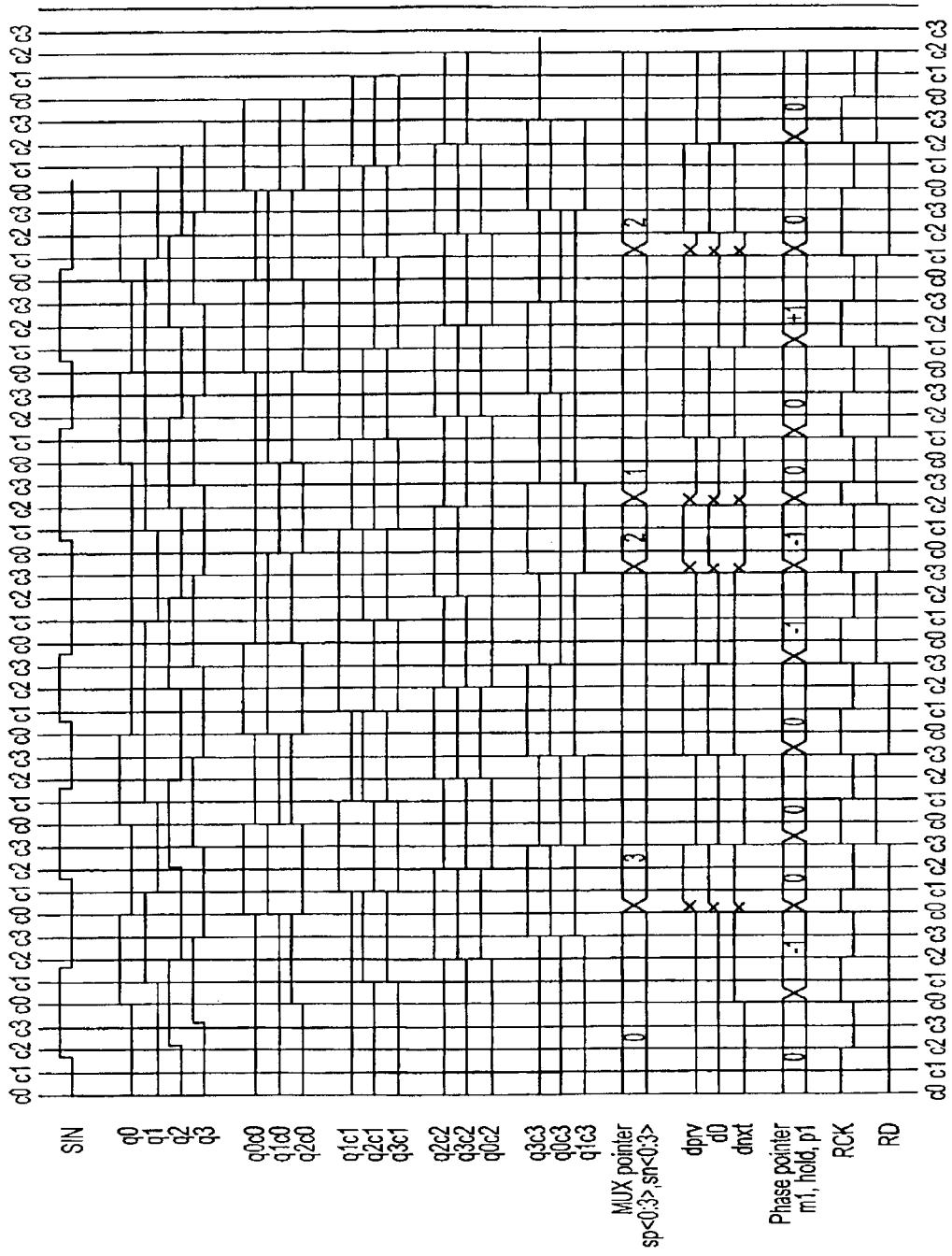
FIG. 4 is an exemplary timing diagram illustrating the operation of the present invention.

The operation of the clock recovery system illustrated in FIG. 3(a) is now explained with reference to the timing diagram set forth in FIG. 4. First, the exemplary incoming asynchronous data stream to be recovered and have a corresponding clock signal generated is illustrated in FIG. 4 and labeled "Sin". The incoming data signal Sin is coupled to the input of each latch 23, 24, 25 and 26 contained in multi-phase sampling unit 22. The first latch 23 is clocked by clock signal, c0, output by the VCO circuit 30. The second latch 24 is clocked by clock signal, c1, output by the VCO circuit 30. The third latch 25 is clocked the clock signal, c2, output by the VCO circuit 30, and the fourth latch 26 is clocked by clock signal, c4, output by the VCO circuit 30. As stated above, each of the four clock signals, c0–c3, have the same frequency, but are out of phase by 90°. Accordingly, the multi-phase sampling unit 12 takes four samples of the incoming data signal Sin over a given clock cycle of the VCO circuit 30. The output of each latch 23, 24, 25 and 26 corresponding to the data signal Sin is illustrated in FIG. 4 as waveforms q0, q1, q2 and q3, respectively.

To summarize the operation of the clock recovery system, the data phase alignment circuit 40 functions in conjunction with the multiplexer 60 to sample three of the four data samples (i.e., q0, q1, q2 and q3) available over a given clock period, which is defined by the frequency of the VCO circuit 30. Initially, samples q0, q1 and q2 are selected and the clock signal associated with the middle sample, q1, is selected as the "recovered clock". Thus, initially, clock signal c1 is selected as the "recovered clock". During each complete clock cycle, the three samples (i.e., q0, q1 and q2) are compared again, and as long as each sample remains a logical low level, the selected clock signal remains c1.

However, in the event the three samples, q0, q1 and q2, are logical levels, for example, L, H and H, respectively, which indicates the selected clock signal is trailing the incoming data signal, the multiplexer 60 in conjunction with the phase decoder 70 and the barrel shifter 80 function to advance the selected clock signal by selecting clock signal c2, and to select the sample q2 and the adjacent samples q1 and q3 for use in the next data comparison. Again, it is noted that the clock signal selected corresponds to the middle sample of the three samples being considered during a given clock cycle.

Continuing with the current example, if the three samples now being considered, namely, q1, q2 and q3, are logical levels L, L and H, respectively, which indicates the selected clock signal is trailing the incoming data signal, the multiplexer 60 in conjunction with the phase decoder 70 and the barrel shifter 80 function to decrement the selected clock signal by selecting clock signal c1, and to select the sample q1 and the adjacent samples q0 and q2 for use in the next data comparison. The foregoing sampling of three data points and the selection and adjustment of the clock signal occurs continuously throughout the operation of the clock recovery system.

FIG. 5 contains a table illustrating how the phase decoder 70 and barrel shifter 80 select the samples (q0–q4) to be considered in accordance with the value of current samples, and how to adjust the selected clock signal (c0–c3). One exemplary embodiment of the phase decoder 70 is set forth below in FIG. 6. However, it is noted that other equivalent decoder circuits can also be utilized so long as the decoder functions to produce the logical function embodied in the table of FIG. 5.

Referring to FIG. 5, there are five relevant permutations of the samples (q0–q4) to be considered. D0 represents the middle sample of the three samples under consideration. Dprv represents the sample preceding sample D0, and Dnxt represents the sample subsequent to sample D0. For example, if the samples currently under consideration are q1, q2 and q3, sample q2 corresponds to D0, sample q1 corresponds to sample Dprv, and sample q3 corresponds to Dnxt.

Referring again to FIG. 5, depending on the value of the samples Dprv, D0 and Dnxt, the barrel shifter 80 adjusts the samples to be considered and the selected clock signal either forward or backward. More specifically, if input M1 of the barrel shifter 80 is logical high, the barrel shifter 80 functions to decrement the selected samples, and therefore the selected clock signal. For example, if the samples currently being considered are q1, q2 and q3 (and have logical values of H, H and L, respectively), the phase decoder 70 outputs a signal wherein M1 is high. As a result, the barrel shifter 80 decrements the samples to be considered and the selected clock signal such that now samples q0, q1 and q2 are considered, and c1 is the selected clock signal.

In the event the sample values result in the phase decoder 70 outputting a signal wherein P1 is high, the barrel shifter 80 functions to increment the selected samples, and the selected clock signal. Continuing the foregoing example, as the samples currently being considered were q0, q1 and q2, assuming P1 is high, the barrel shifter 80 increments the samples to be considered and the selected clock signal such that now samples q1, q2 and q3 are considered, and c2 is the selected clock signal. This process continues throughout the operation of the system.

The specific details of the operation of the clock recovery system illustrated in FIG. 3 is now described with reference to FIG. 4. As stated above, each of the latches 23–26 contained in the multi-phase sampling unit 22 sample the incoming data signal in accordance with the respective sampling clocks, c0–c3, output by the VCO circuit 30. The output signals of latches 23, 24, 25 and 26 are q0, q1, q2 and q3, respectively, as illustrated in FIG. 4. The data phase alignment circuit 40, which receives output signals q0, q1, q2 and q3, functions to select the three samples to be considered, as well as adjust the phase of the three samples such that the three sample are "in phase" at the time of the comparison.

More specifically, initially, samples q0, q1 and q2 are considered. However, as these samples are each 90° out of phase with one another, they must be shifted so as to be "in-phase" with one another prior to making the necessary comparison. The data-phase alignment circuit 40 accomplishes this realignment by shifting each sample in time. Referring to FIGS. 3 and 4, sample q0 read into the c0 line, and is then read out of the data-phase alignment circuit 40 at either the next c0 (by selecting latch 49), or the next c2 (by selecting latch 47) or the next c3 (by selecting latch 48). Similarly, sample q1 read into the c1 line, and is then read out of the data-phase alignment circuit 40 at either the next c1 (by selecting latch 52), or the next c3 (by selecting latch 50) or the next c0 (by selecting latch 51). Sample q2 read into the c2 line, and is then read out of the data-phase alignment circuit 40 at either the next c2 (by selecting latch 55), or the next c1 (by selecting latch 53) or the next c0 (by selecting latch 54). Finally, sample q3 read into the c3 line, and is then read out of the data-phase alignment circuit 40 at either the next c3 (by selecting latch 59), or the next c1 (by selecting latch 57) or the next c2 (by selecting latch 58).

Continuing the foregoing example, samples q0, q1 and q2, which are currently being considered, are "shifted" and compared at the next c0 clock edge. This occurs by selecting IN0 of the first three multiplexers 61, 62 and 63, which are coupled to latches 49, 51 and 53, respectively. To summarize, selection of IN0 results in the comparison of samples q0, q1 and q2 at the next leading edge of c0. Selection of IN1 results in the comparison of samples q1, q2 and q2 at the next leading edge of c1. Selection of IN2 results in the comparison of samples q2, q3 and q0 at the next leading edge of c2. Finally, selection of IN3 results in the comparison of samples q3, q0 and q1 at the next leading edge of c3. Thus, the data-phase alignment circuit 40 functions in conjunction with the multiplexer 60 to realign the samples to be considered and present the samples to the phase decoder 70.

As noted above, the output of the fourth 4:1 multiplexer 64 represents the recovered clock signal. Accordingly, when IN0, IN1, IN2 or IN3 is selected by the barrel shifter 80, the recovered clock corresponds to c0, c1, c2 or c3, respectively. The output of the fourth 4:1 multiplexer 64 is also utilized to gate latch 90, the output of which represents the recovered data signal, so as to synchronize the recovered clock signal with the recovered data signal.

Referring again to the example set forth in FIG. 4, during the first complete clock cycle (i.e., c0—c0), sample q0=0, q1=0, q2=1 and q3=1. In accordance with the present embodiment, sample q0, q1 and q2 are shifted to the next edge of c0, and are represented by signals q0c0, q1c0 and q2c0, respectively. Accordingly, at the second occurrence of c0 in FIG. 4, signals q0c0, q1c0 and q2c0 equal L, L and H, respectively. However, referring to FIG. 5, a L, L, H causes the barrel shifter 80 to decrement the samples to be considered (i.e., the phase pointer equal −1, meaning decrement). As such, the clock signal selected "RCK" corresponds to c1.

At the next sampling point, samples q3, q0 and q1 are considered and equal H, H and H, respectively. Thus, at the third occurrence of c0, signals q3c3, q0c3 and q1c3 equal H, H and H, respectively. Referring to FIG. 5, a H, H, H result mandates that the barrel shifter 80 does not cause a change in the samples being considered, and the phase pointer returns to 0. As such, the clock signal selected remains c1.

The foregoing process continues throughout the operation of the system. For example, as illustrated in FIG. 4, as the phase pointer has repetitive values of −1 over two clock cycles, the corresponding clock signal selected (as well as the corresponding three samples considered) is decremented from c3 to c2 and then again from c2 to c1. The selected clock signal is then incremented from c1 to c2, when the incoming data results in the phase pointer having a value of +1.

FIG. 6 illustrates an exemplary embodiment of the phase decoder circuit 70. As shown, the exemplary embodiment of the phase decoder 70 comprises three input lines 71–73, each of which receive one of the three selected samples (which are identified as Dnxt, D0 and Dprv). Each input line is coupled to an input buffer 74, which has an inverted and non-inverted output. The output lines of the buffers 74 are coupled to the various logic gates illustrated in FIG. 6, which are selected to obtain the state table set forth in FIG. 5. Of course, other combinations of logic gates can be utilized to obtain the desired state table.

Figure 7:
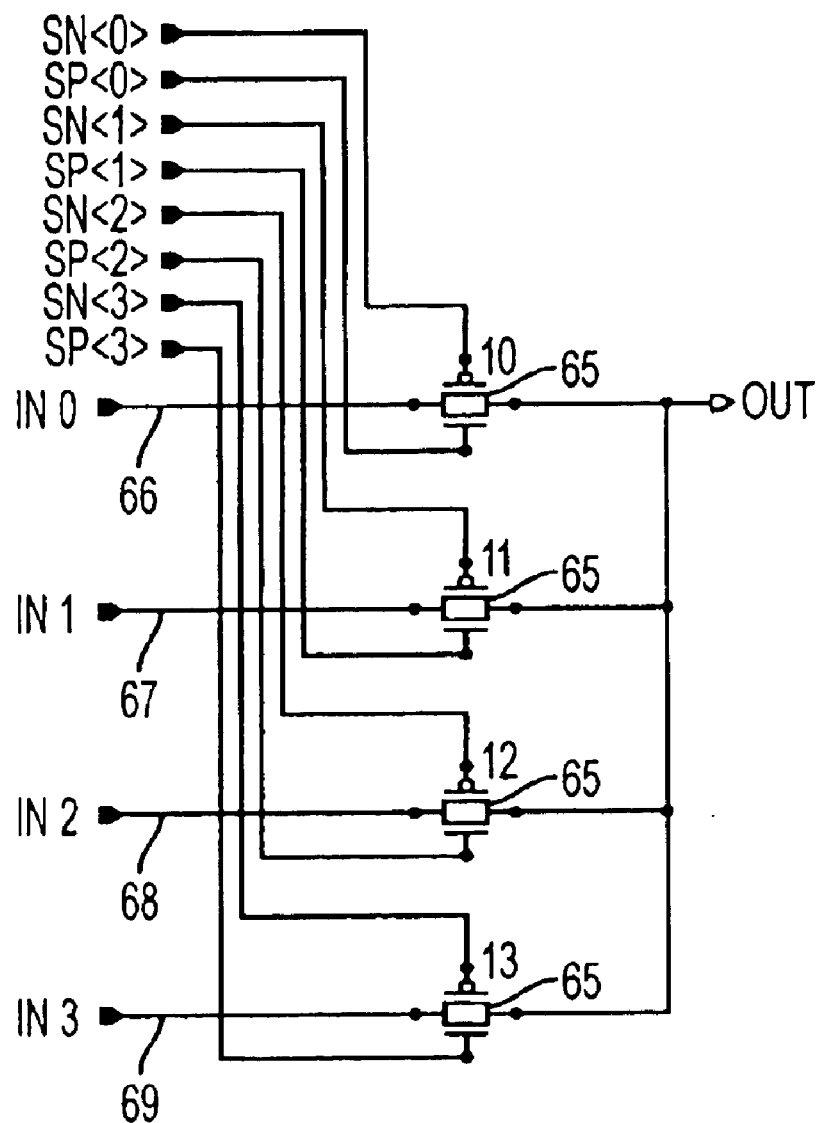

FIG. 7 illustrates an exemplary embodiment of one of the 4:1 multiplexers contained in the multiplexer circuit 60. It is noted that each of the four multiplexers 61, 62, 63 and 64 have the same configuration. As shown, each multiplexer 61–64 comprises four input lines 66–69, each of which is coupled to switch 65. Each switch 65 is controlled by the output lines SN<1–4> of the barrel shifter 80.

Figure 8:
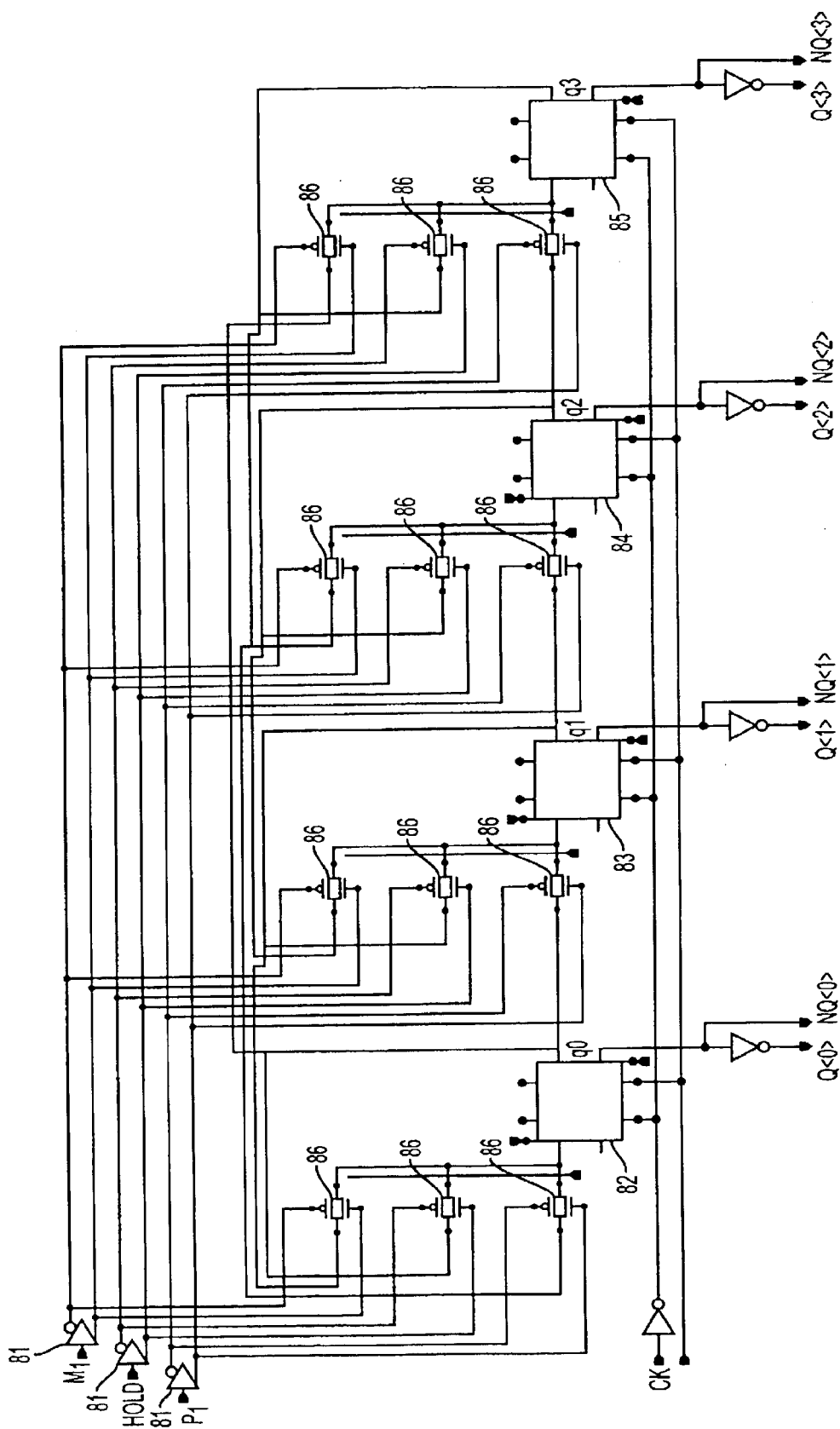

FIG. 8 illustrates an exemplary embodiment of the barrel shifter 80. As shown, the barrel shifter 80 comprises three input lines, M1, Hold, and P1, each of which is coupled to an input buffer 81. The barrel shifter 80 further comprises four latches 81–85, each of which has three switches 86 coupled to the input thereof. As set forth above, the barrel shifter 80 functions to decrement the samples to be considered (e.g., q1, q2, q3 ->q0, q1, q2) when input M1 is high, and functions to increment the samples to be considered (e.g., q0, q1, q2 ->q1, q2, q3) when the input P1 is high.

Figure 9A:
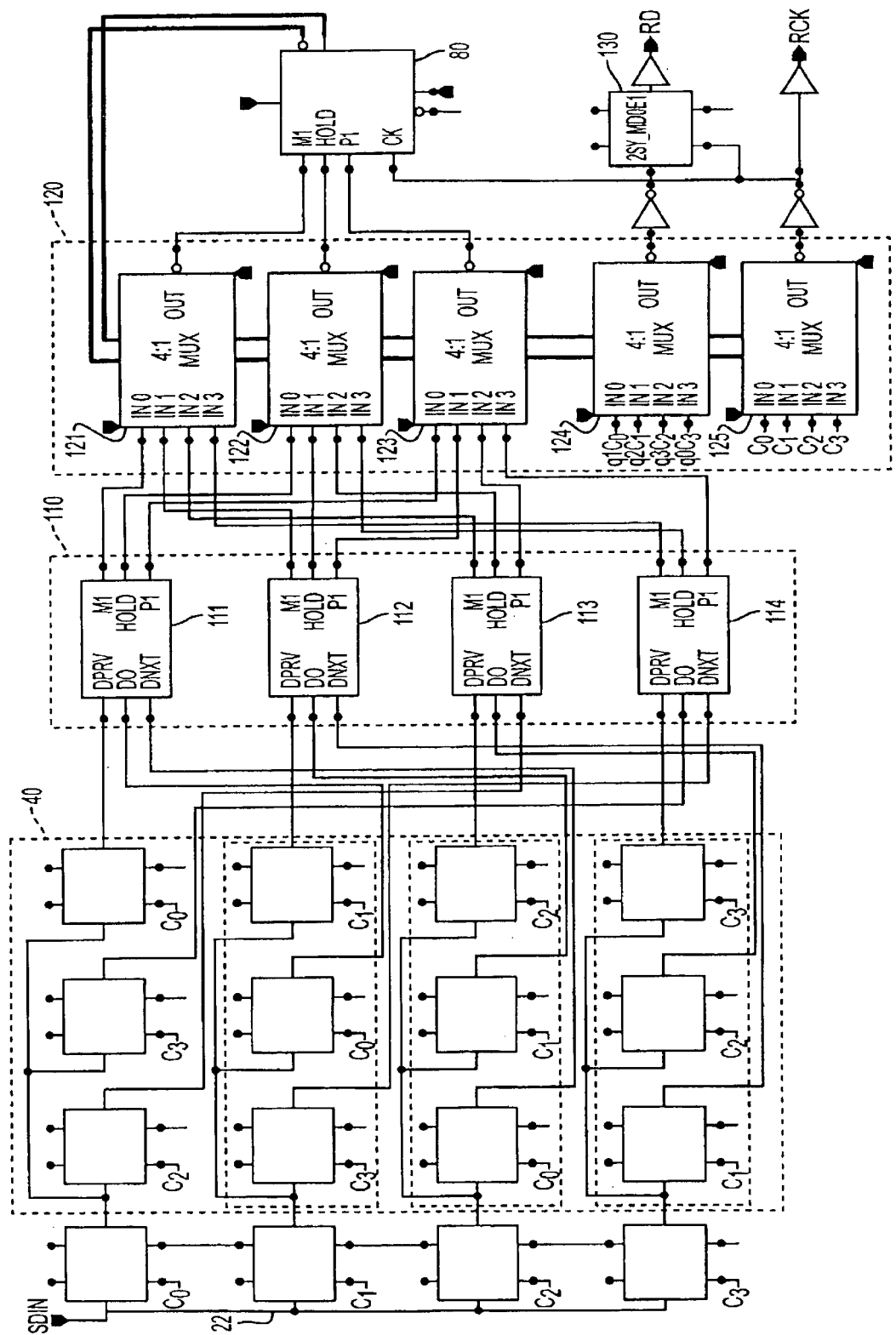
FIG. 9a illustrates a second embodiment of the clock recovery system of the present invention.

FIG. 9a illustrates a second embodiment of the clock recovery system of the present invention. Importantly, the second embodiment allows for an increase in the maximum allowable data rate due to the removal of the phase decoder disposed between multiplexer circuit and the barrel shifter in the first embodiment.

Figure 9B:
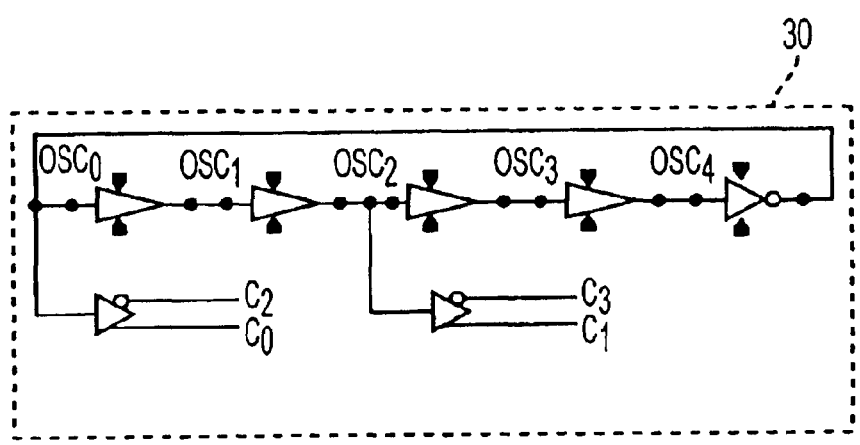
FIG. 9b illustrates an exemplary embodiment of the multi-phase sampling clock circuit utilized in the second embodiment of the present invention.

Referring to FIG. 9b, VCO circuit 30, a multi-phase sampling unit 22 and a data phase alignment circuit 40, which are all identical to the corresponding components in the first embodiment. However, in the second embodiment, the output of the data phase alignment circuit 40 is coupled to a phase decoder unit 110. As shown, the phase decoder unit 110 comprises four identical phase decoders 111, 112, 113 and 114, which are identical to the phase decoder disclosed in the first embodiment.

In operation, the first phase decoder 111 functions to compare samples q0, q1 and q2 at the next leading edge of c0. The second phase decoder 112 functions to compare samples q1, q2 and q3 at the next leading edge of c1. The third phase decoder 113 functions to compare samples q2, q3 and q0 at the next leading edge of c2. Finally, the fourth phase decoder 114 functions to compare samples q3, q0 and q1 at the next leading edge of c3.

The output of each of the four phase decoders 111–114 is generated in accordance with the table illustrated in FIG. 5. Thus, each individual phase decoder 111–114 contained in the phase decoder 110 functions in the same manner as the phase decoder described in conjunction with the first embodiment. As shown, the outputs of the first phase decoder 111, M1, Hold and P1 are coupled to the IN0 inputs of multiplexes 121, 122 and 123, respectively, which are contained in the multiplexer circuit 120. Similarly, the outputs of the second phase decoder 112, M1, Hold and P1 are coupled to the IN1 inputs of multiplexes 121, 122 and 123, respectively. The outputs of the third phase decoder 113, M1, Hold and P1 are coupled to the IN2 inputs of multiplexes 121, 122 and 123, respectively. Finally, the outputs of the fourth phase decoder 114, M1, Hold and P1 are coupled to the IN3 inputs of multiplexes 121, 122 and 123, respectively. The outputs of multiplexers 121, 122, 123, are coupled to the M1, Hold, P1 inputs of barrel shifter 80.

Thus, in accordance with the operation of the second embodiment, the decoded results of the comparison of samples q0, q1 and q2 are coupled to the barrel shifter 80 by selecting IN0 inputs of the multiplexers 121–123. The decoded results of the comparison of samples q1, q2 and q3 are coupled to the barrel shifter 80 by selecting IN1 inputs of the multiplexers 121–123. The decoded results of the comparison of samples q2, q3 and q0 are coupled to the barrel shifter 80 by selecting IN2 inputs of the multiplexers 121–123. Finally, the decoded results of the comparison of samples q3, q0 and q1 are coupled to the barrel shifter 80 by selecting IN3 inputs of the multiplexers 121–123.

The multiplexer circuit 120 of the second embodiment further comprises an additional two multiplexers 123 and 125. Multiplexer 124 receives samples q1c0, q2c1, q3c2 and q0c3 at input lines IN0, IN1, IN2 and IN3, respectively. The output of multiplexer 124, which is controlled by the barrel shifter 80, is coupled to latch 130 and represents the recovered data signal. As shown, latch 130 is clocked by the recovered clock signal "RCK" so as to synchronize the recovered clock signal with the recovered data signal. In operation, the data sample utilized in the recovered data signal at a given point in time corresponds to middle sample of the three samples under consideration by the barrel shifter 80. For example, if the barrel shifter 80 is currently considering samples q0, q1 and q2, the sample output by the latch 130 is q1 (i.e., the "middle" sample).

In a similar fashion, multiplexer 125 receives clock signals c0, c1, c2 and c3 at input lines IN0, IN1, IN2 and IN3, respectively. The output of multiplexer 125, which is also controlled by the barrel shifter 80, represents the recovered clock signal, and is utilized to clock both the barrel shifter 80 and the latch 130. In operation, the clock sample utilized in the recovered clock signal at a given point in time corresponds to clock signal associated with the middle sample of the three samples under consideration by the barrel shifter 80. For example, if the barrel shifter 80 is currently considering samples q0, q1 and q2, the clock output by the multiplexer 125 is c1.

Similar to the operation of the first embodiment, depending on the value of the signals, M1, Hold and P1 coupled to the barrel shifter 80, the barrel shifter 80 adjusts the samples to be considered and the selected clock signal either forward or backward. More specifically, if the input M1 of the barrel shifter 80 is logical high, the barrel shifter 80 functions to decrement the selected samples, and therefore the selected clock signal. For example, if the samples currently being considered were q1, q2 and q3 (i.e., IN1 is currently selected), and the samples had logical values of H, H and L, respectively, the barrel shifter 80 receives a signal wherein M1 is high. As a result, the barrel shifter 80 decrements the samples to be considered and the selected clock signal such that now samples q0, q1 and q2 are considered, and c1 is the selected clock signal. In other words, now IN0 is selected.

In the event the sample values result in the barrel shifter 80 receiving a signal wherein P1 is high, the barrel shifter 80 functions to increment the selected samples, and the selected clock signal. Continuing the foregoing example, as the samples currently being considered were q0, q1 and q2, assuming P1 is high, the barrel shifter 80 increments the samples to be considered and the selected clock signal such that now samples q1, q2 and q3 are considered, and c2 is the selected. In other words, IN1 is selected. This process continues throughout the operation of the system. It is noted that the second embodiment of the present invention increases the overall speed of operation of the device as compared to the first embodiment due to the elimination of the phase decoder 110 from the loop formed by the barrel shifter 80 and the multiplexer 120.

Figure 10A:
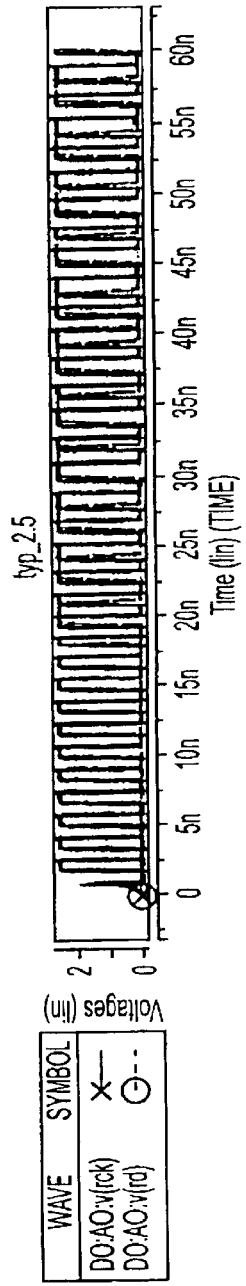
FIGS. 10a–10f illustrate the actual results of the operation of the second embodiment of the system of the present invention.
Figure 10B:
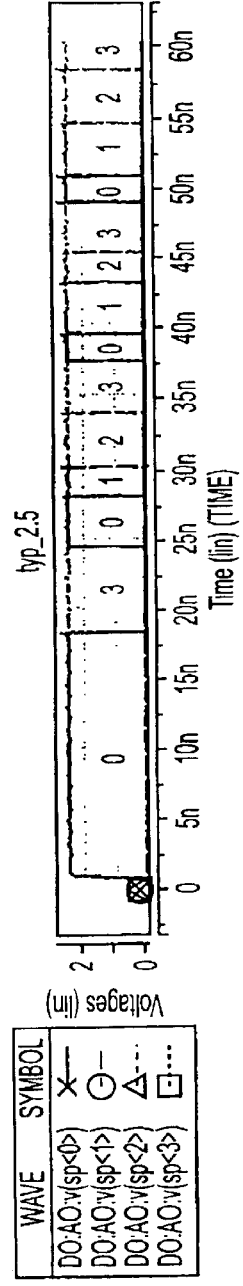
Figure 10C:
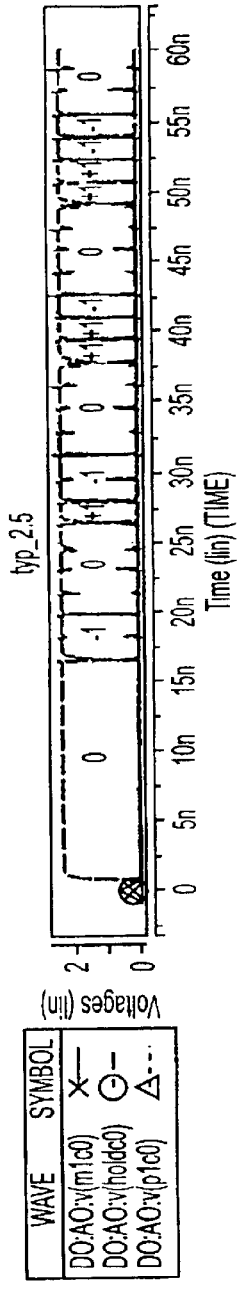
Figure 10D:
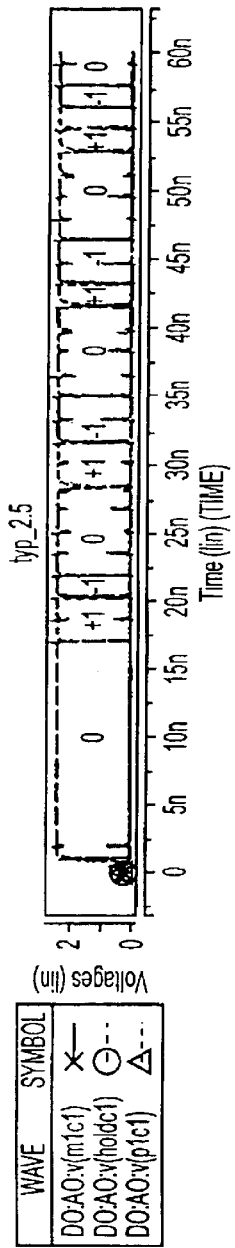
Figure 10E:
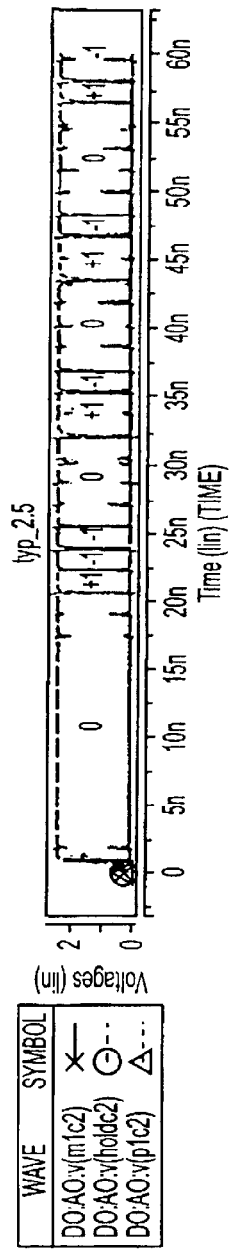
Figure 10F:
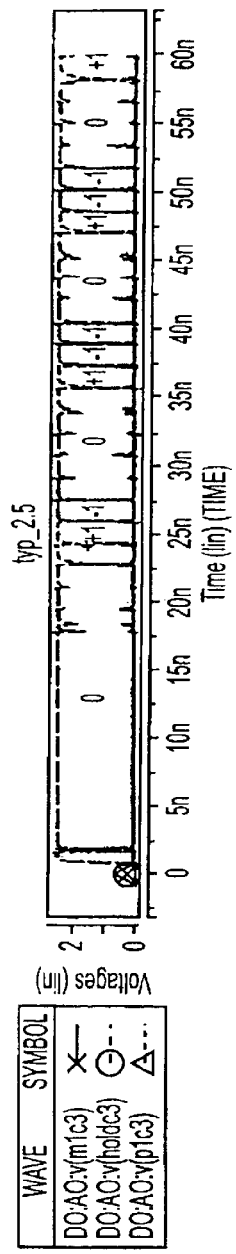

FIGS. 10a–10f illustrate exemplary the operation of the second embodiment of the system of the present invention. More specifically, FIG. 10a illustrates an exemplary input signal. FIG. 10b illustrates the corresponding output of the barrel shifter 80 based on the input signal of FIG. 10a. FIGS. 10c–10f correspond to the outputs of phase decoders 111, 112, 113 and 114, respectively, based on the input signal of FIG. 10a.

Figure 11A:
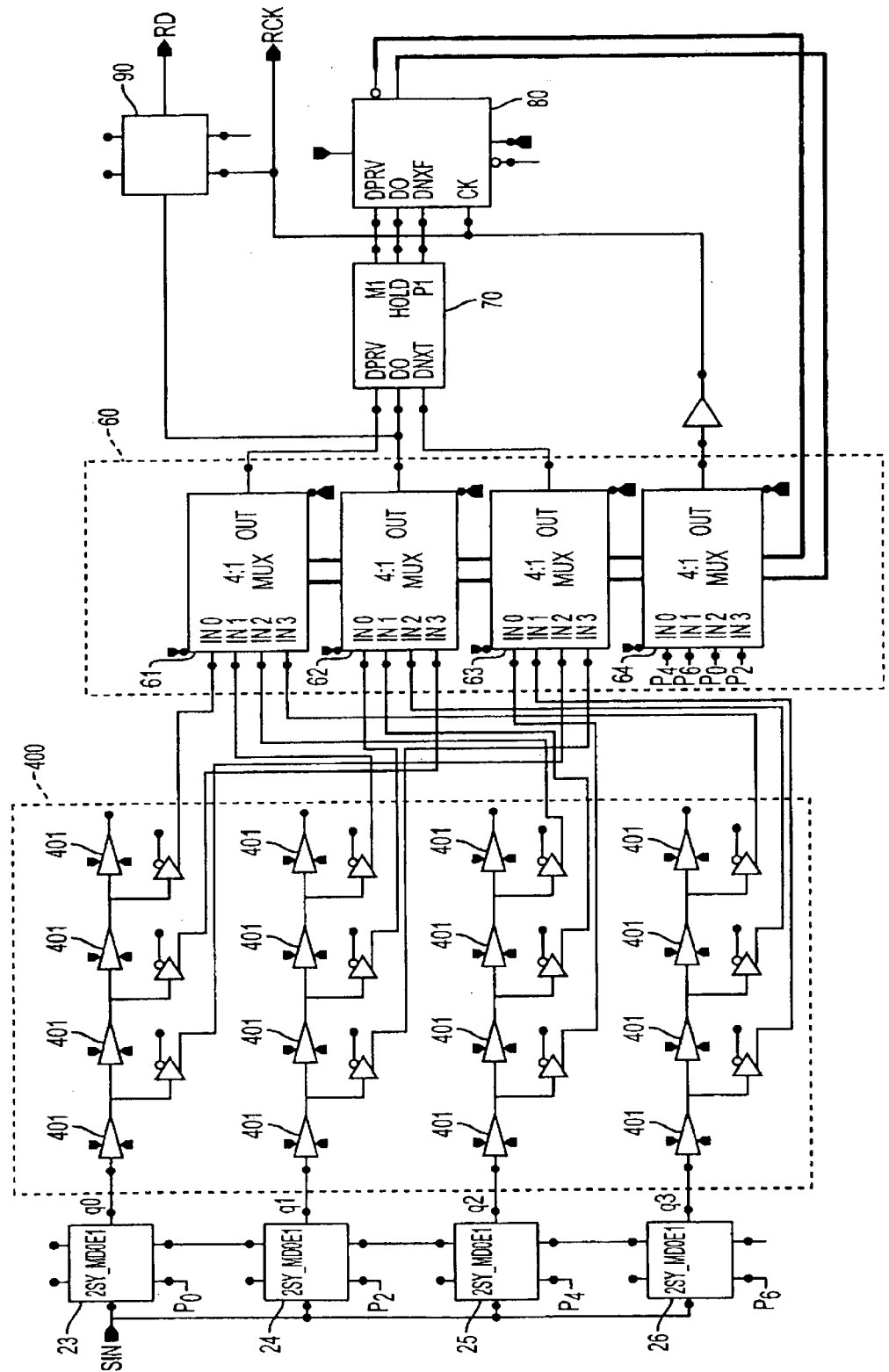
FIG. 11 illustrates a third embodiment of the clock recovery system of the present invention.
Figure 11B:
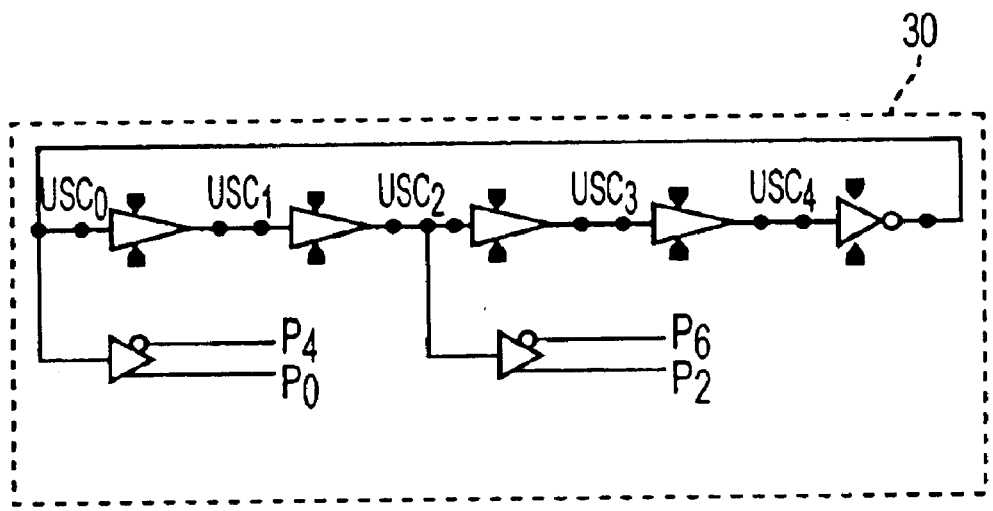
Figure 12A:
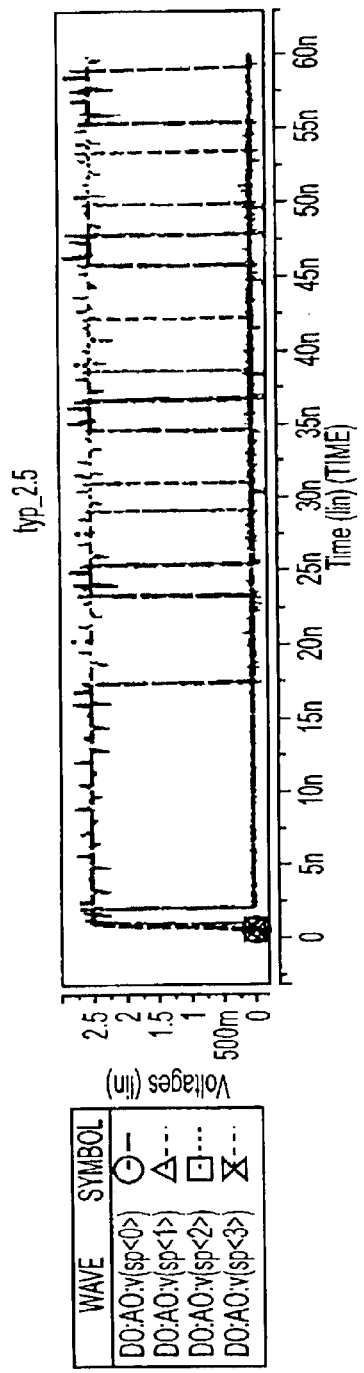
FIGS. 12a–12d illustrate the actually results of the operation of the first embodiment of the system of the present invention.
Figure 12B:
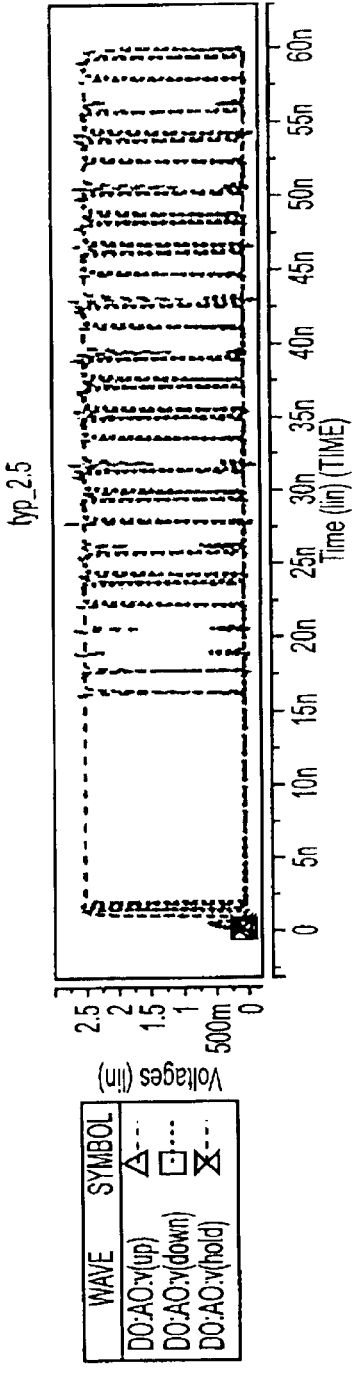
Figure 12C:
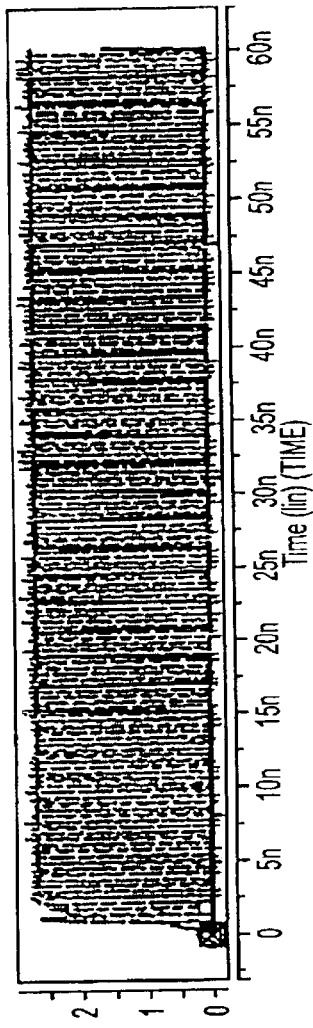
Figure 12D:
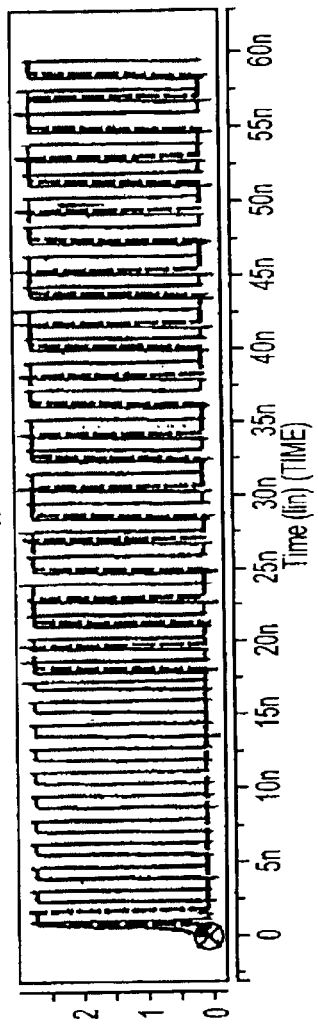

FIG. 11 illustrates a third embodiment of the clock recovery system of the present invention. As shown in FIG. 11, the data phase alignment circuit 400 comprises actual delay elements 401 as opposed to flip-flops (as contained in the first embodiment). All other elements of the third embodiment are identical to those of the first embodiment. The delay elements 401 are utilized to phase shift the samples being considered such that the samples are "in-phase" when selected by the multiplexer 60. Each delay element 401 has a delay substantially equal to ¼ of the overall clock cycle of VCO circuit 30.

With regard to the operation, for example, assuming IN0 is being selected by the barrel shifter 80, samples q0, q1 and q2 are coupled to the IN0 input of multiplexers 61, 62 and 63, respectively. However, sample q0 is delayed three ¼ clock cycles before being coupled to IN0 of multiplexer 61. Sample q1 is delayed two ¼ clock cycles before being coupled to IN0 input of multiplexer 62. Sample q2 is delayed one ¼ clock cycles before being coupled to the IN0 input of multiplexer 63. As such, samples q0, q1 and q2 are in-phase when selected by the multiplexers 61–63 and coupled to the phase decoder 70. All of the other samples subjected to a comparison by selection of either IN1, IN2 or IN3 are phase-shifted in a similar manner.

FIGS. 12a–12d illustrate the actually results of the operation of the first embodiment of the system of the present invention. Specifically, sp<0 to 4> represents positive output signals of the barrel shifter 80. Up, down and hold represent p1, hold and m1 of the phase decoder, respectively. P0, p2, p4 and p6 represent 4-phase clock signals which are labeled c0, c1, c2 and c3 in FIG. 3a, respectively. Sin represents the incoming serial data signal, which is labeled SDIN in FIG. 3a. Rck and Rd represent the recovered clock and data signals, which are synchronized by the system.

Figure 13:
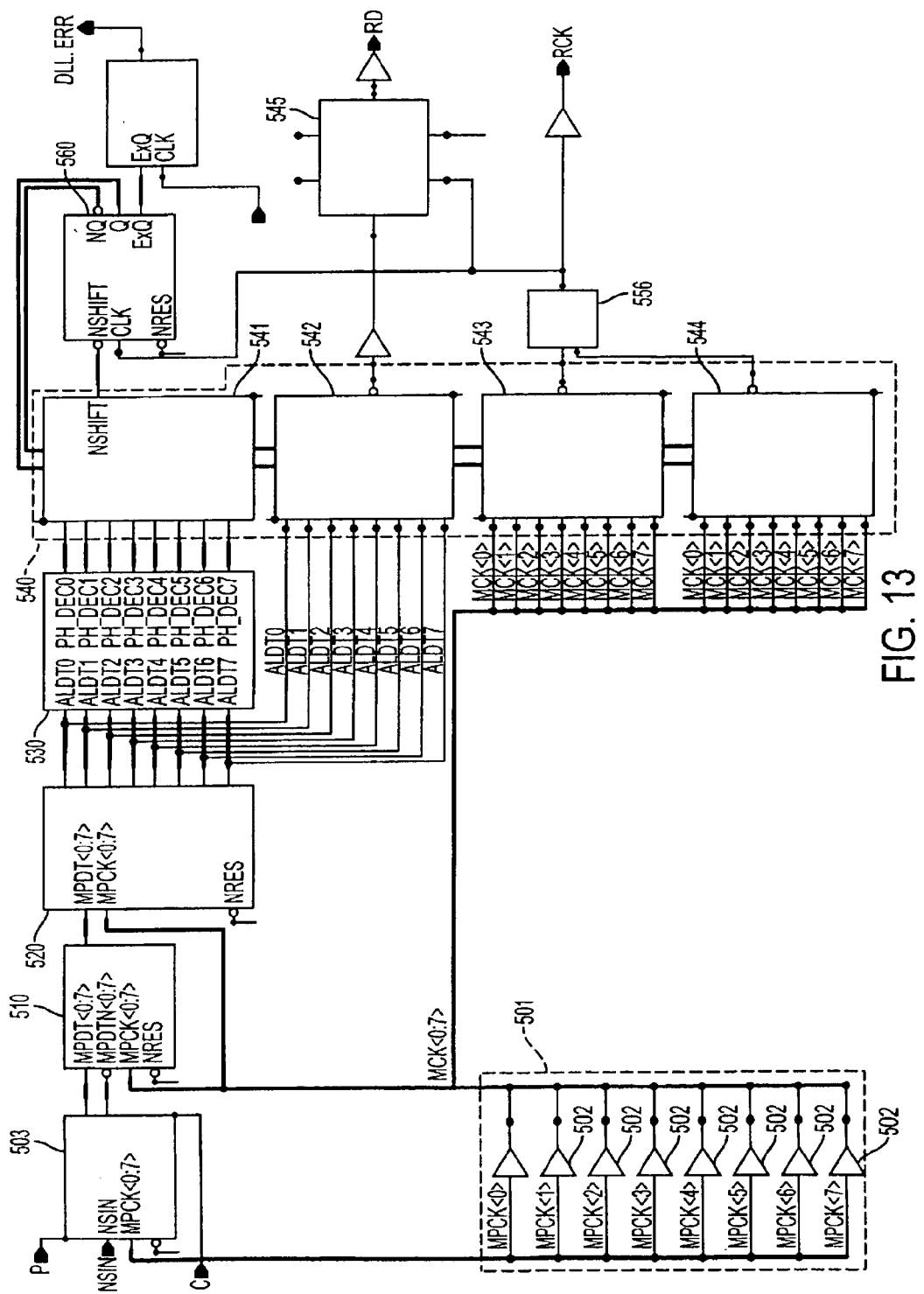
FIG. 13 illustrates a fourth embodiment of the present invention.

FIG. 13 illustrates a fourth embodiment of the present invention, which functions to compensate and/or provide for acceptable variations in the phase of the incoming serial data signal. More specifically, as one example, the USB 2.0 specification requires allowance for a 20% margin associated with the phase of the incoming data signal. As such, the width of the data pulses of the incoming data signal are variable within the defined allowable margin.

Thus, depending upon the location of the sampling point utilized by the clock recovery unit, it is possible that the pulse width variations of the incoming signal results in non-convergence, or in others words, an error in reading the incoming data signal. The embodiment of the present invention illustrated in FIG. 13 provides for the proper receipt and identification of the incoming data signal even in the instance where the pulse width of the incoming pulse varies within a predefined tolerance (i.e., margin).

Figure 26:
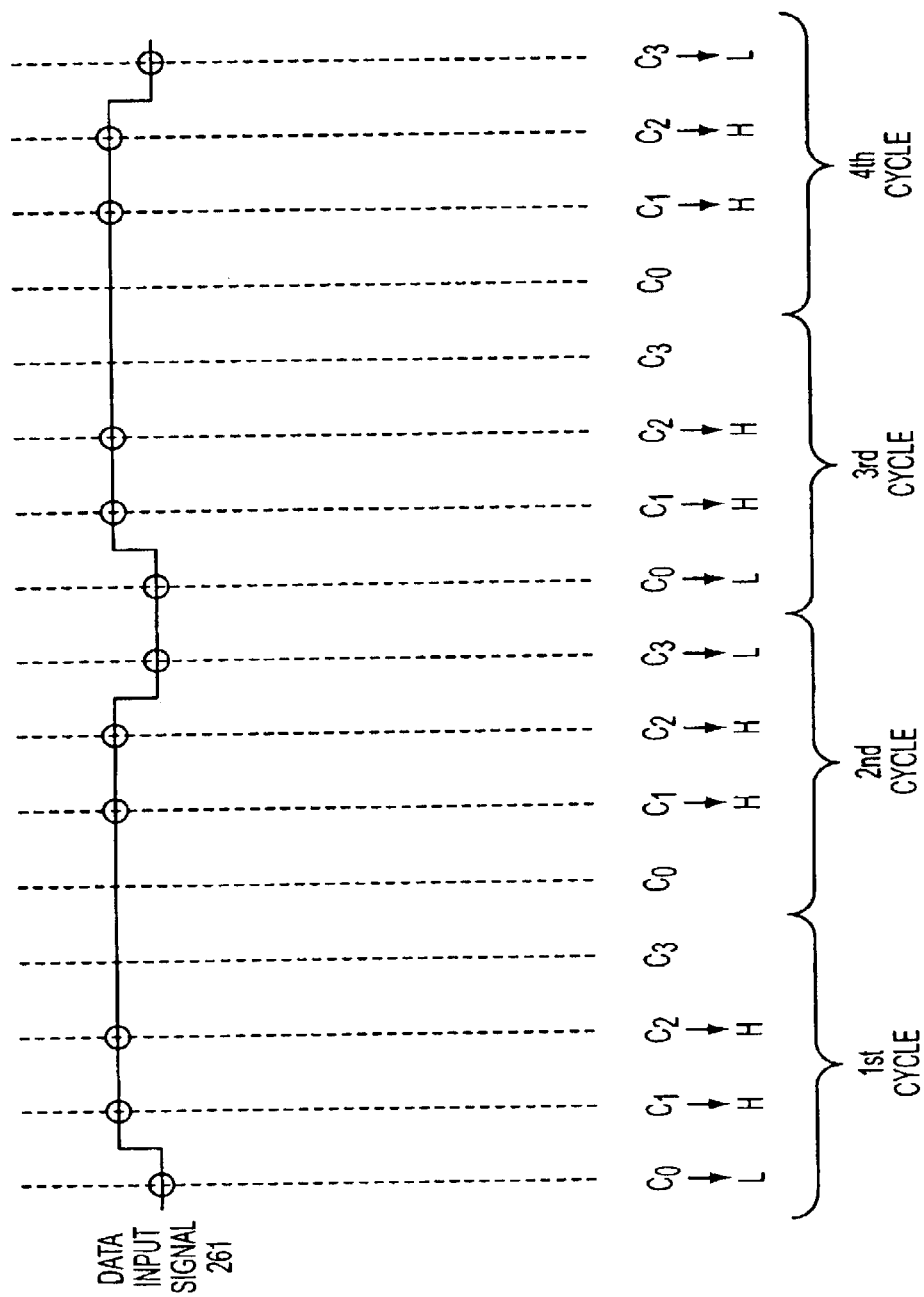
FIG. 26 is a timing diagram illustrating one of the problems solved by the fourth embodiment of the present invention.

FIG. 26 sets forth a timing diagram which illustrates one of the problems solved by the fourth embodiment of the present invention. Referring to FIG. 26, the exemplary incoming signal 261 exhibits an extended pulse width for each logical "1 " data, and a shortened pulse width for each logical "0". As a result, utilizing the 4-phase detection scheme detailed above, during the first cycle, sample C0, C1 and C2 are detected. In the given example, C0, C1 and C2 are L, H, H, respectively. This results in the phase detector incrementing the barrel shifter by one such that samples C1, C2 and C3 are detected during the second cycle. As shown, during the second cycle C1, C2 and C3 are H, H, L, respectively. This results in the phase detector decrementing the barrel shifter by one such that samples C0, C1 and C2 are detected during the third cycle. As shown, during the third cycle C0, C1 and C2 are L, H, H, respectively, which causes the barrel shifter to once again increment such that C1, C2 and C3 are detected during the fourth cycle. During the fourth cycle, C1, C2 and C3 are H, H, L, respectively.

However, as explained above, as the middle sample of the three samples taken during a given cycle is selected as the data sample, the detected output of the foregoing example would be erroneously H for each of the first to fourth cycles. Specifically, in the first cycle C1 defines the output data and is H. In the second cycle C2 defines the output data and is H. In the third cycle C1 defines the output data and is H, and in the fourth cycle C2 defines the output data and is H. Thus, even though the actually input signal is transitioning from high to low (logical 1 to logical 0), because the pulse width of the logical 1 data is extended (the same problem occurs if the logical 1 pulses are too short in duration), it is possible to improperly and/or erroneously detect the incoming data signal.

As stated above, the embodiment of the present invention set forth in FIG. 13 eliminates the foregoing potential problem. It can be shown that the minimum pulse width of incoming pulses necessary to prevent the aforementioned non-convergence is equal to 1–the resolution of the system. Accordingly, in the event the minimum pulse width defined by the application or standard being applied fails to satisfy the foregoing equation it is possible for the incorrect reading of incoming data (i.e., non-convergence) to occur. The embodiment of the present invention illustrated in FIG. 13 eliminates this potential problem by effectively extending the width of the incoming pulses in situations where the incoming pulse fails to satisfy the minimum pulse width requirements necessary to prevent such non-convergence from occurring.

Referring to FIG. 13, the clock recovery system of the fourth embodiment comprises an eight phase VCO circuit 610 and a sampling clock generation unit 501 comprising clock buffer elements 502. The VCO circuit 610 comprises a plurality of delay elements 632 coupled in series and four inverters 633–636, each of which have an inverted and a non-inverted output. Each of the clock signals c0–c7 have the same frequency, which is approximately equal to the expected frequency of the incoming asynchronous data signal. However, each clock signal is phase shifted with respect to the other clock signal by 45° The operation of the VCO circuit 610 is essentially the same as the VCO circuit illustrated in FIG. 3(b) and described above.

The sampling clock generation unit 501 receives the 8 clock signals generated by the VCO circuit 610, and functions to generate a stable 8-phase clock signal, mck<0:7>. Thus, the output of the sampling clock generation unit 501 comprises 8 individual clock signals each having the same frequency, but shifted in phase from one another by 1/8 of the frequency associated with the clock signal MPCK. In other words, eight clock/sampling signals are generated, and each of them is separated in phase by 45°. It is noted that it is not intended that the present invention as illustrated in FIG. 13 be limited to an eight phase implementation.

Figure 14:
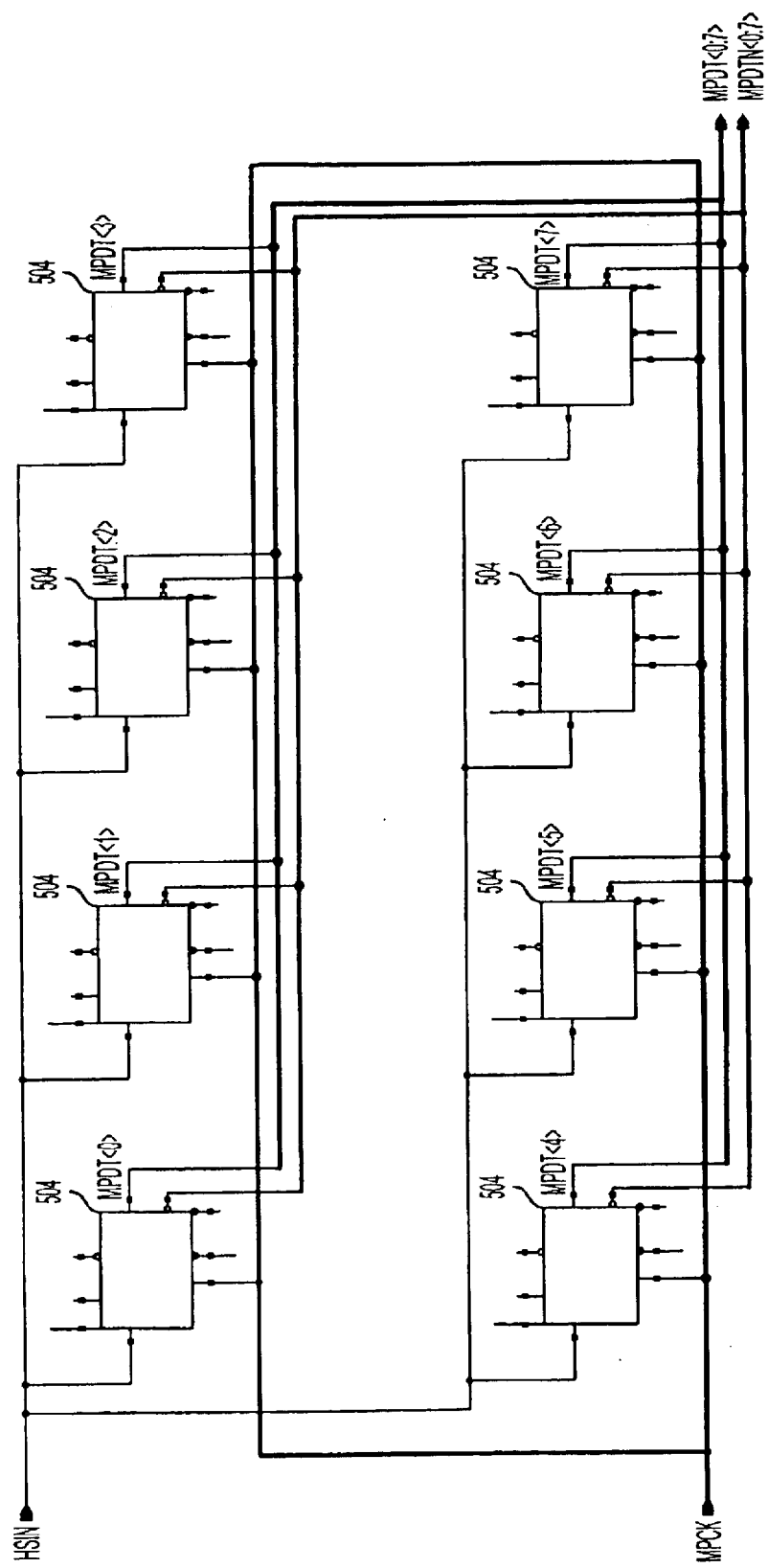
FIG. 14 illustrates an exemplary embodiment of the sampling unit utilized in the fourth embodiment of the present invention.
Figure 25A:
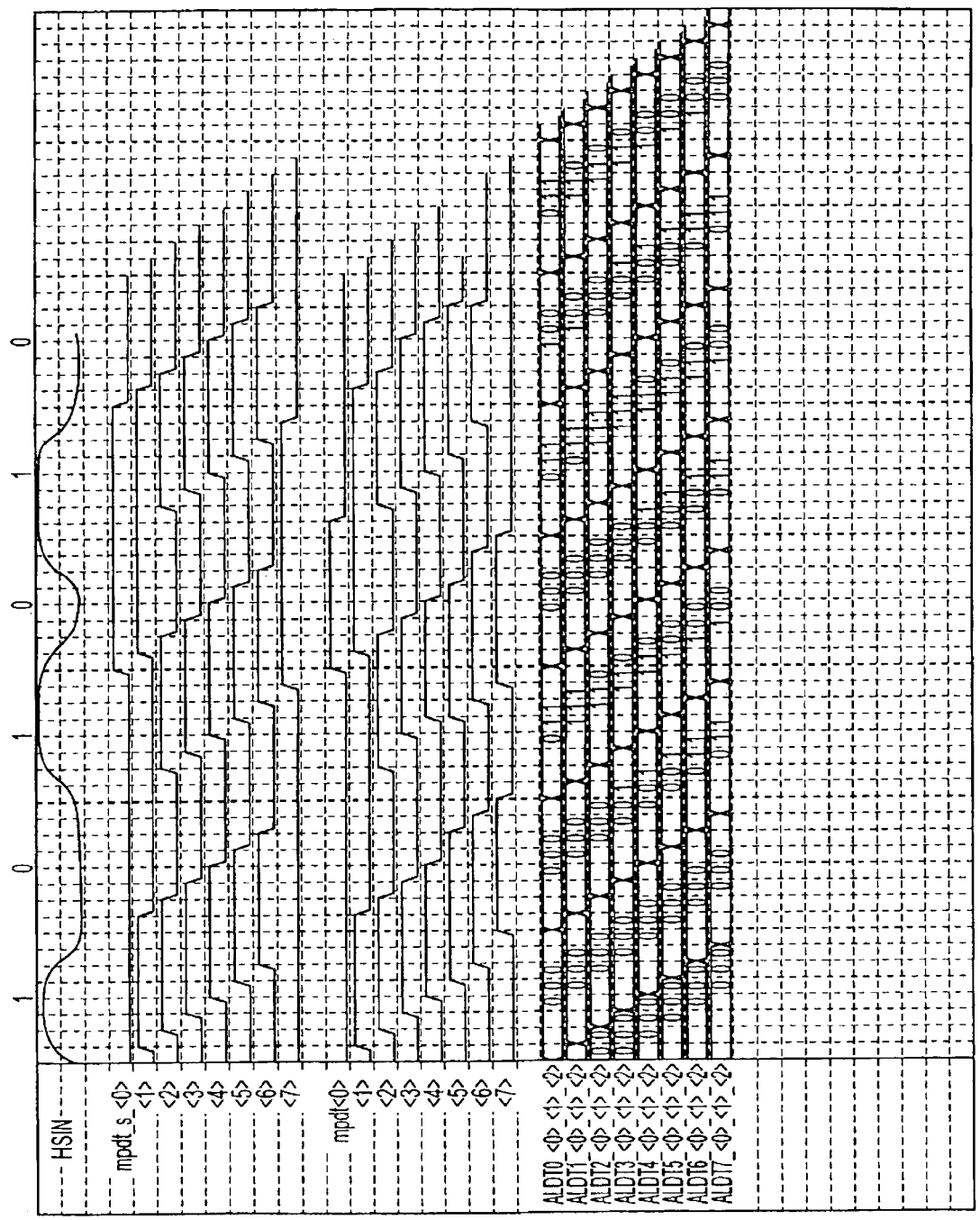
FIGS. 25a–25g are exemplary timing diagrams illustrating the operation of the fourth embodiment of the present invention.

The clock recovery system further comprises a sampling unit 503 which receives the incoming data signal HSIN as an input signal and the 8-phase clock signal generated by the VCO circuit 610 as a clocking signal. FIG. 14 illustrates an exemplary embodiment of the sampling unit 503. As shown in FIG. 14, the sampling unit comprises 8 D-type flip-flops 504, each of which receives the data signal HSIN as an input signal. Each D-type flip-flop functions to sample the incoming data signal HSIN at a given phase defined by the 8-phase clock MPCK <0:7>. The output of the sampling unit 503 comprises 8 separate data signals. FIG. 25a illustrates an exemplary incoming data signal, HSIN, and the corresponding output generated by the sampling unit 503, which is mpdt_s<0:7>.

Returning to FIG. 13, the clock recovery system of the fourth embodiment further comprises a pulse width adjustment circuit 510. As shown, the pulse width adjustment circuit 510 is coupled to the sampling unit 503 and receives the sampled data signals mpdt_s<0:7> as an input signal. The pulse width adjustment circuit 510 also receives the output of the sampling clock generation unit 501, namely mck<0:7>, as an input clock signal. The pulse width adjustment circuit 510 functions to adjust the width of the pulses contained in the signal mpdt_s<0:7> as described below. An exemplary output of the pulse width adjustment circuit 510 is also illustrated in FIG. 25a. It is noted that the exemplary output signals of the pulse width adjustment circuit 510 are based on the input signals mpdt_s<0:7> also illustrated in FIG. 25a.

Figure 15A:
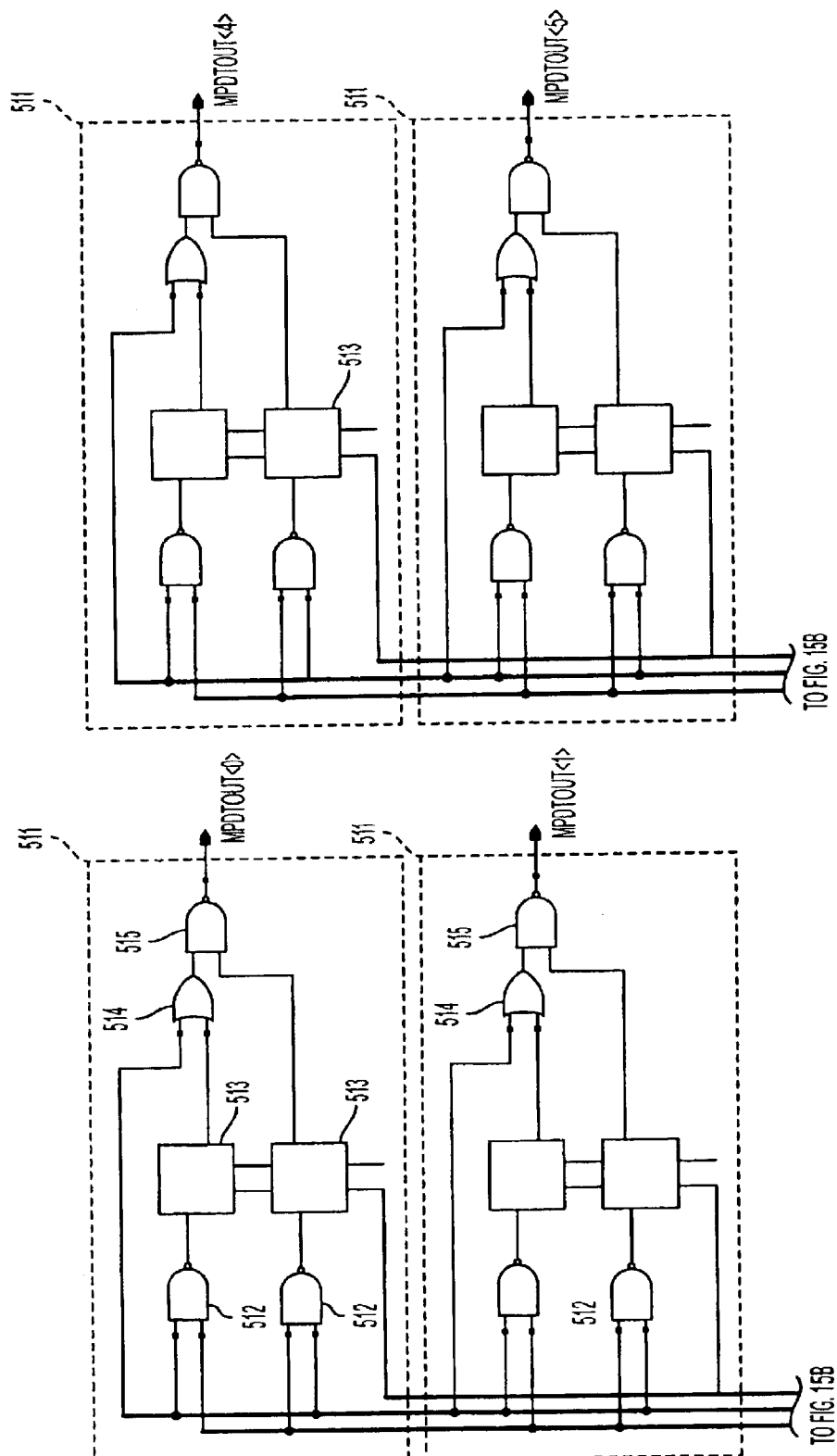
FIG. 15 illustrates an exemplary embodiment of the pulse width adjustment circuit utilized in the fourth embodiment of the present invention.
Figure 15B:
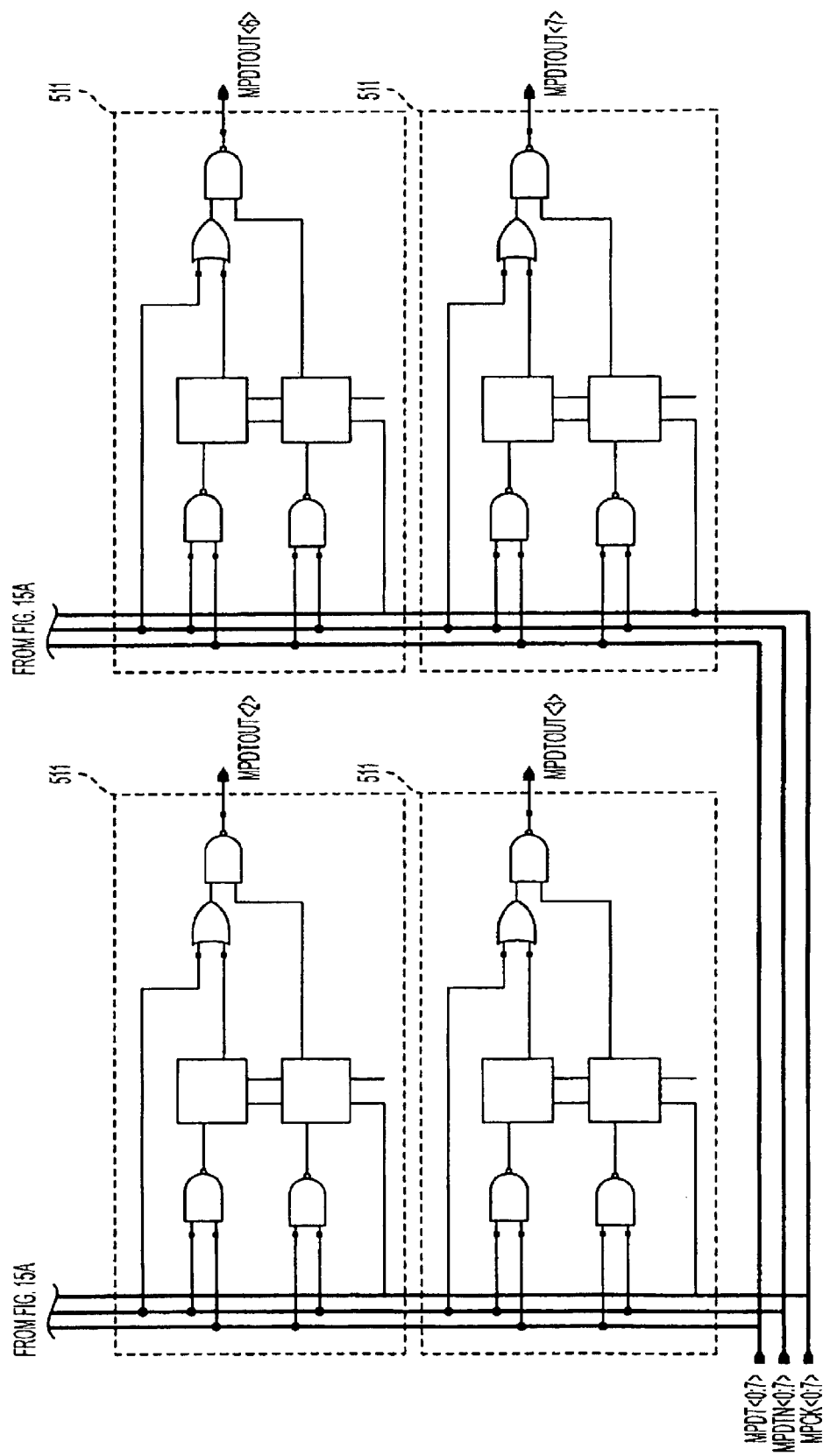

FIG. 15 illustrates a detailed exemplary embodiment of the pulse width adjustment circuit 510 of the present invention. As shown, the pulse width adjustment circuit 510 generates 8 individual output signals, each one of which corresponds to one of the 8 sampling periods defined by sampling clock generation unit 501. Referring again to FIG. 15, the pulse width adjustment circuit 510 comprises eight substantially identical circuit structures 511, each of which comprises two NAND gates 512, two D-type flip-flops 513, an OR gate 514 and an AND gate 515. Each of the eight circuit structures 511 receives three of the eight data signals output by the sampling unit 503 as input signals, and one of the clock signals mck<0:7> as an input clock signal.

To summarize, the pulse width adjustment circuit 510 functions to extend the pulse width of the incoming data signal such that the pulse width is not below a predetermined minimum width based on system resolution. In the current embodiment, the pulse width adjustment circuit operates as follows. As stated above, the current embodiment employs an eight phase clock scheme, wherein eight clock/sampling signals are generated, and each of them is separated in phase by 45°. Under ideal operation, each logical "1" pulse (i.e., input signal) would be present for an entire clock cycle, or in other words it would be present for all eight phases of the eight phase clock (i.e., 8/8). The same is true for logical "0" pulses. In the event the incoming pulses are present for less than the ideal amount, as stated above, the pulse width adjustment extends the width of the pulse. In the present embodiment, if the pulse width of the incoming data signal is present for only 4/8 of the entire clock cycle, the pulse width adjustment circuit functions to extend the width of the pulse such that it becomes 7/8 of the clock cycle (i.e., present for 7 of the eight phases). If the pulse width of the incoming data signal is present for 5/8 of the entire clock cycle, the pulse width adjustment circuit functions to extend the width of the pulse such that it becomes 7/8 of the clock cycle. If the pulse width of the incoming data signal is present for 6/8 of the entire clock cycle, the pulse width adjustment circuit functions to extend the width of the pulse such that it becomes 7/8 of the clock cycle. If the pulse width of the incoming data signal is present for either 7/8, 8/8, 1/8, 2/8 or 3/8 of the entire clock cycle, the pulse width adjustment circuit does not make any adjustment to the width of the incoming pulse. It is noted that the foregoing pulse width modifications are not intended to be limiting. Other variations regarding how and when to extend the pulse width are possible. As noted above, the desired/necessary pulse width extension is based on the resolution and tolerance figures of the particularly system. The prescribed adjustments set forth above are intended to be exemplary in nature, and in no way limiting.

Referring to the circuitry of the pulse width circuit 510 illustrated in FIG. 15, as is shown, the two NAND gates 512 function to detect either a falling edge or a rising edge between the corresponding data points (e.g., data samples corresponding to clock C0 and C4) input into the NAND gates. The output of the NAND gates 512 are then clocked through the respective D flip-flops 513 coupled thereto. The output of one of the D flip flops 513 is coupled to the OR gate 514, which also receives as an input the inverted data sample corresponding to the sample output of the given circuit 511. The output of the other D flip-flop 513 is coupled to the AND gate 515, which also receives as an input, the output of OR gate 514. The output of the NAND gate 515 represents the pulse width adjusted data sample corresponding to the given circuit 511.

In operation, each circuit 511 functions to monitor a transition (e.g., logical "1" to logical "0") during a previous sample period which would indicate that the current pulse sample is either too short (or too long). If there is a transition detected, circuit 511 functions to prevent a transition of the given output sample (e.g., C0) that would result in an undesirable short pulse width, which would otherwise occur if the output sample was simply allowed to track the input signal. For example, referring to FIG. 15 and the first circuit 511 having an output corresponding to sample C0, this circuit 511 monitors and detects rising and falling edges between previous samples C1 and C4, and if a transition occurred during the previous sample between C1 and C4, the circuit 511 prevents a transition in C0 that would result in an unacceptable short pulse width. Each of the other seven circuit 511 function in an identical manner, with the exception that each circuit generates one of samples C1–C7 and that each circuit monitors a different previous sample period. It is noted that the embodiment of FIG. 15 represents only one possible circuit for providing the pulse width adjustment required by the present embodiment. Other circuits for performing this function are possible.

Figure 25B:
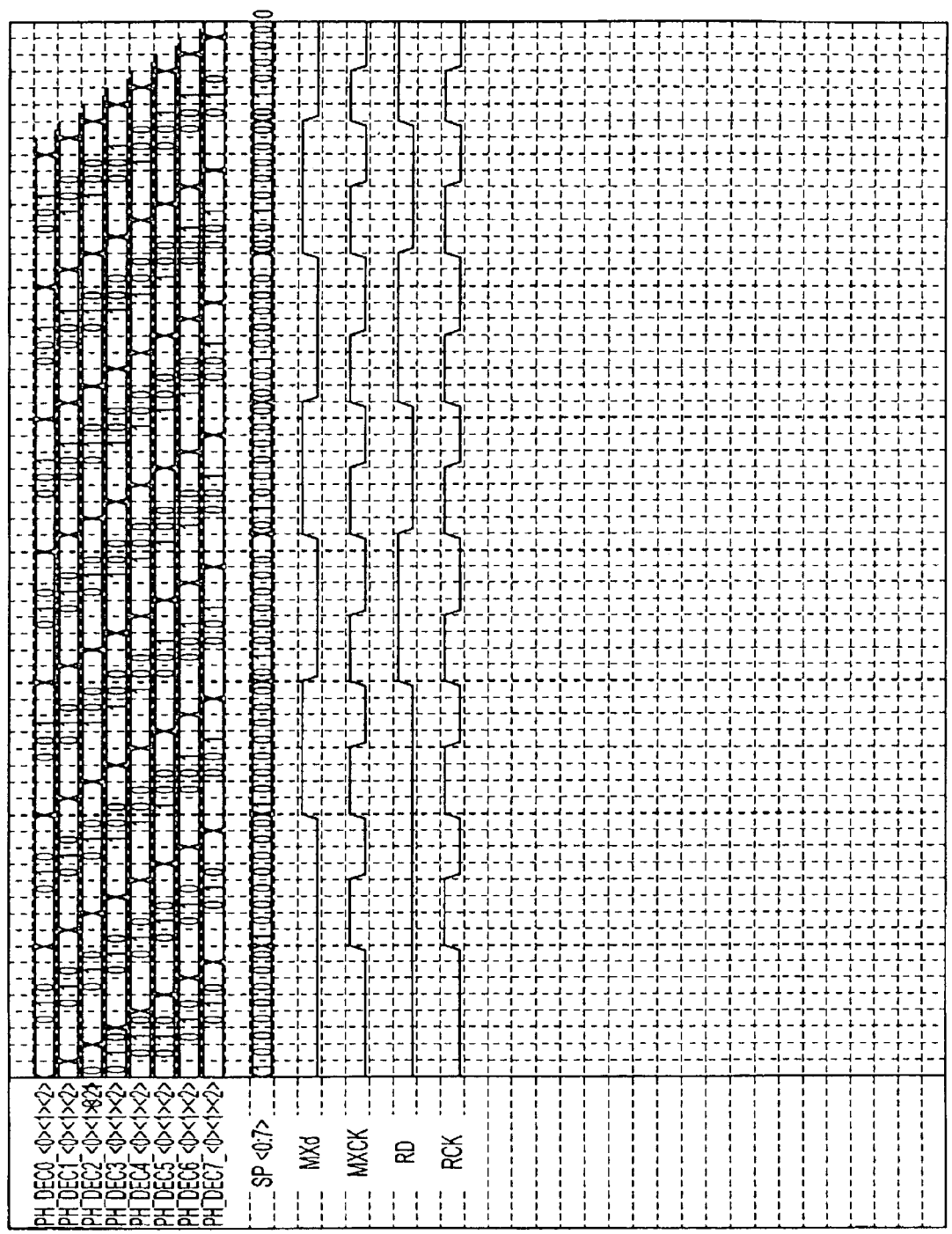
Figure 25C:
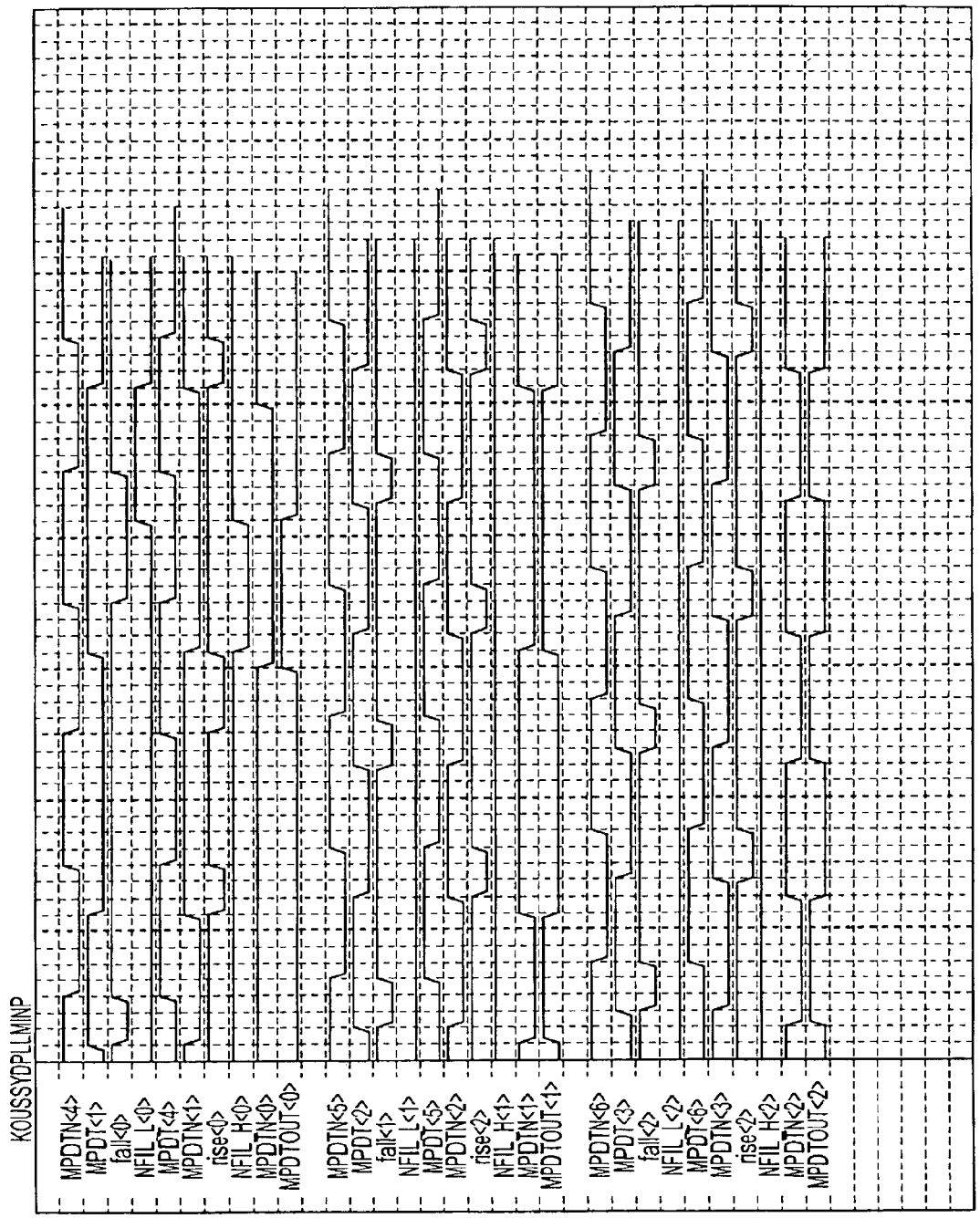
Figure 25D:
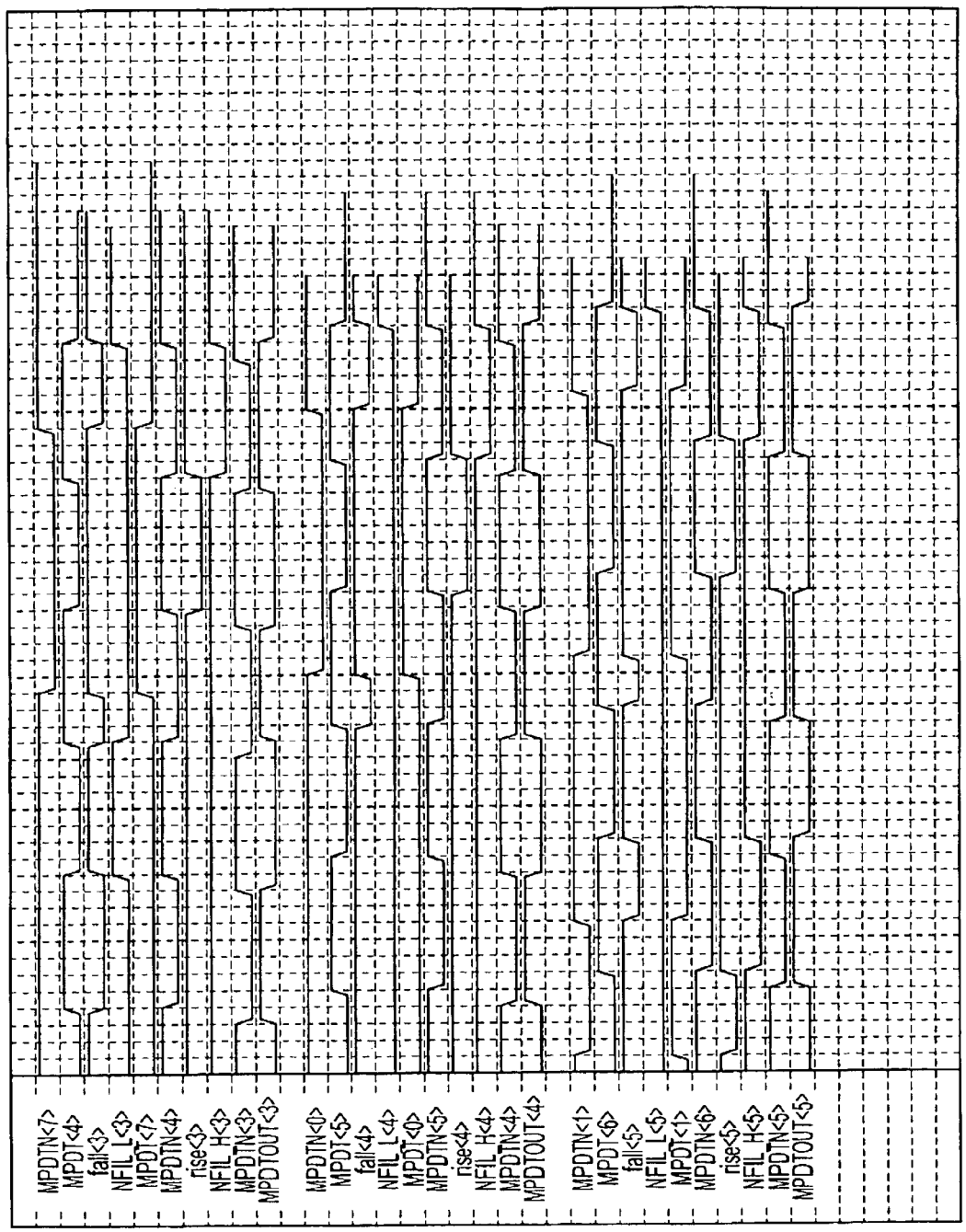
Figure 25E:
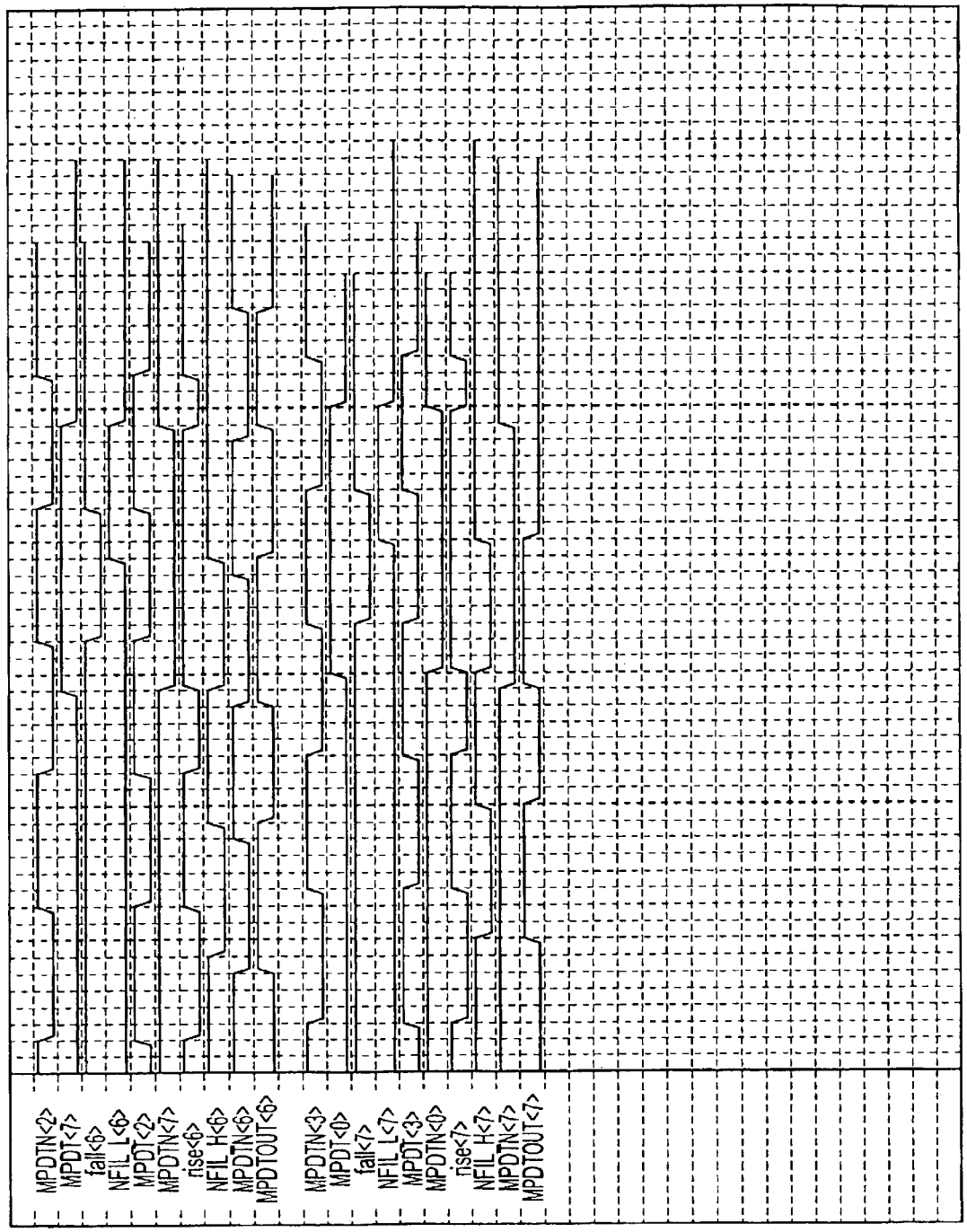

FIG. 25a illustrates the operation of the pulse width adjustment circuit 510 on the sample data input signal HSIN. The output of the pulse width adjustment circuit 510 is indicated as mpdt <0:7>. A detailed example of the operation of the circuits 511 forming the pulse width adjustment circuit 510 is depicted in the timing diagrams set forth in FIGS. 25c–e.

As explained in further detail below, the fourth embodiment of the clock recovery system further comprises a data alignment unit 520, a phase decoder unit 530, a multiplexer unit 540 and a barrel shifter unit 550 all of which perform substantially the same functions as the corresponding components described above with regard to the first and second embodiments of the present invention.

Figure 16:
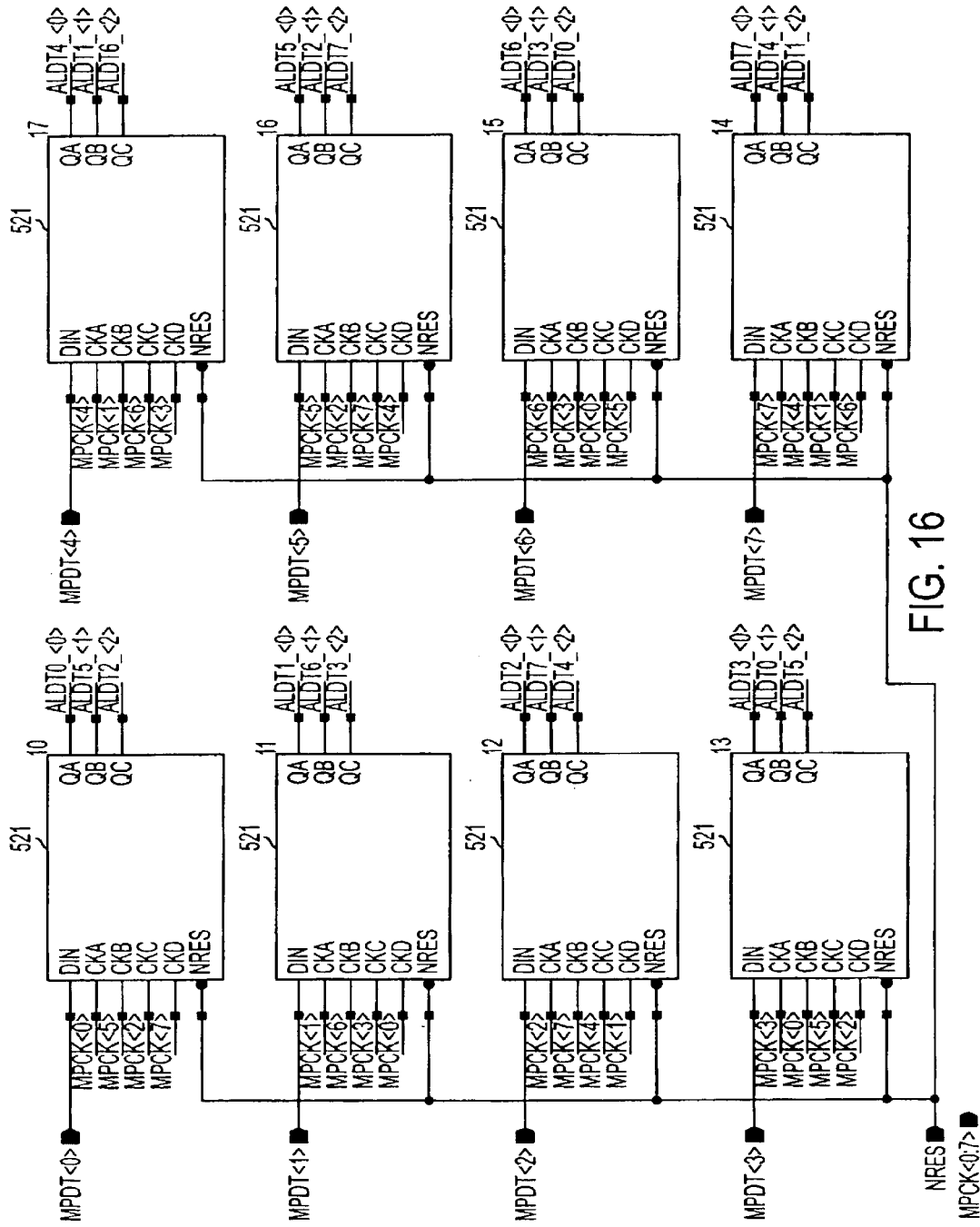
FIG. 16 illustrates an exemplary embodiment of the data alignment unit utilized in the fourth embodiment of the present invention.

More specifically, FIG. 16 illustrates an exemplary embodiment of the data alignment unit 520 of the fourth embodiment. As shown, the data alignment unit 520 comprises eight identical alignment circuits 521. Each alignment circuit 521 receives four different clock signals of the eight generated by the sampling clock generation unit 501. In addition, each of the eight alignment circuits 521 receives one of the eight distinct output signals generated by the pulse width adjustment circuit 510. Similar to the first embodiment, each alignment circuit 521 functions to align data samples taken at the sample time indicated by the input clock signal coupled to the given alignment circuit, so as to allow for subsequent comparison of the samples.

Figure 17:
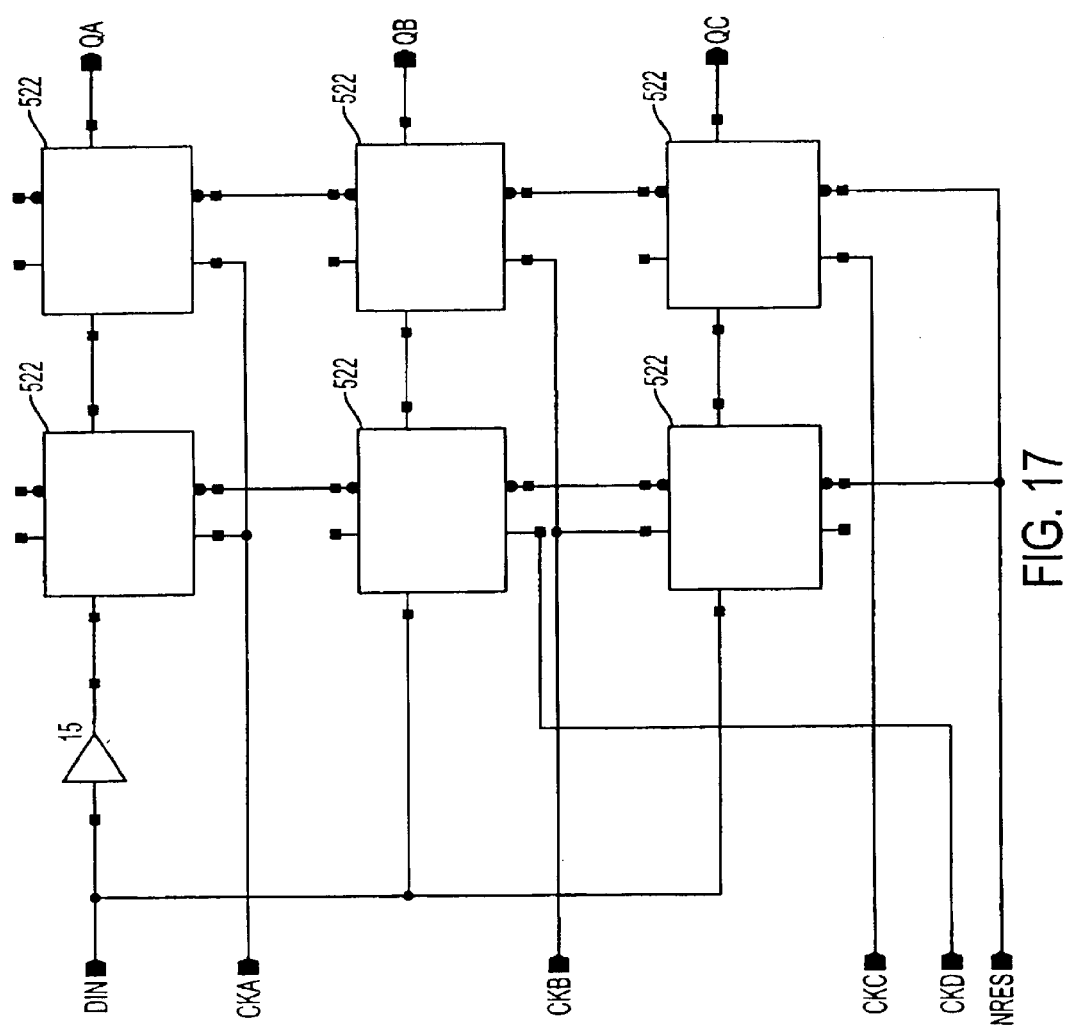
FIG. 17 illustrates an exemplary embodiment of an alignment circuit utilized in the data alignment unit of FIG. 16.
Figure 25F:
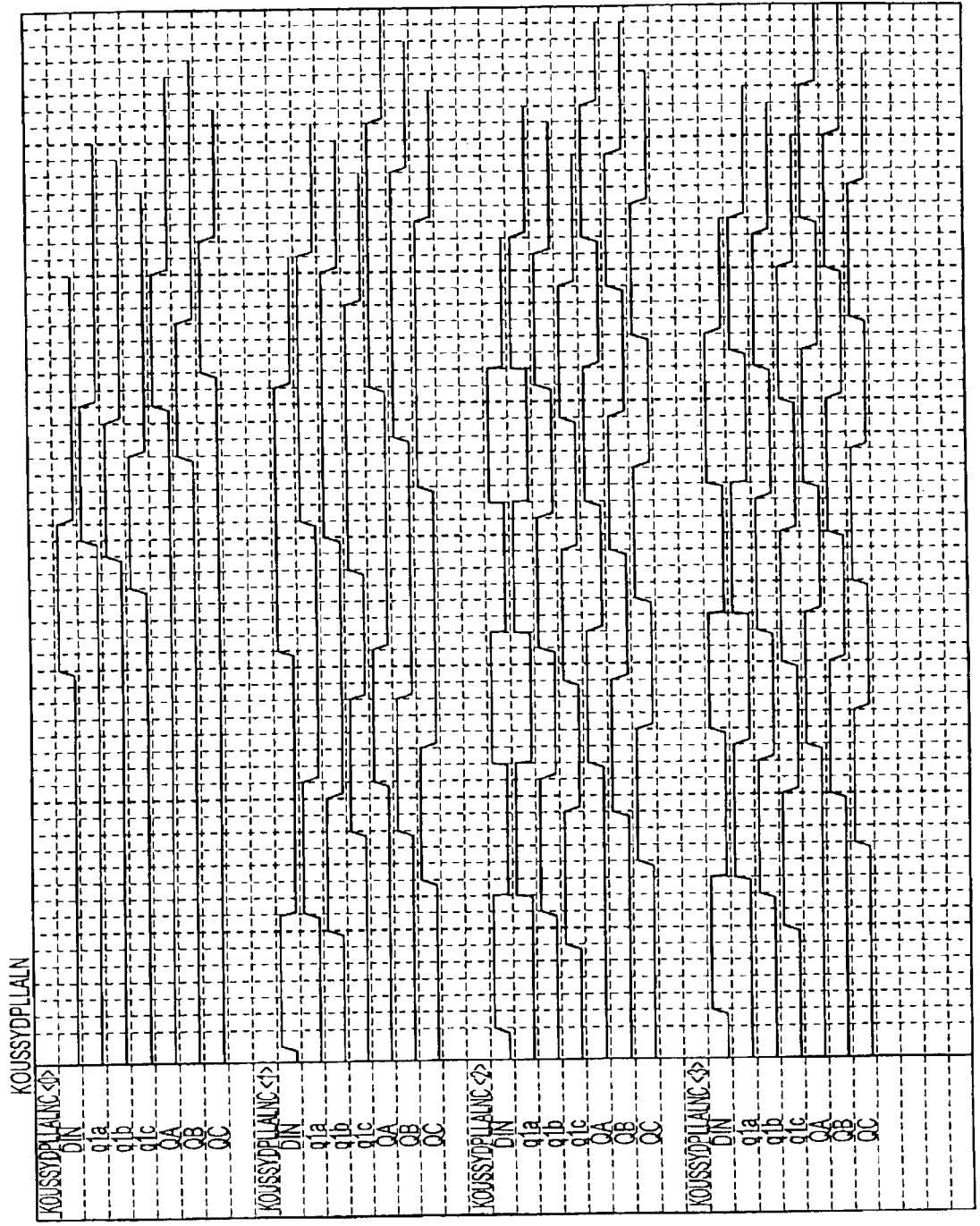
Figure 25G:
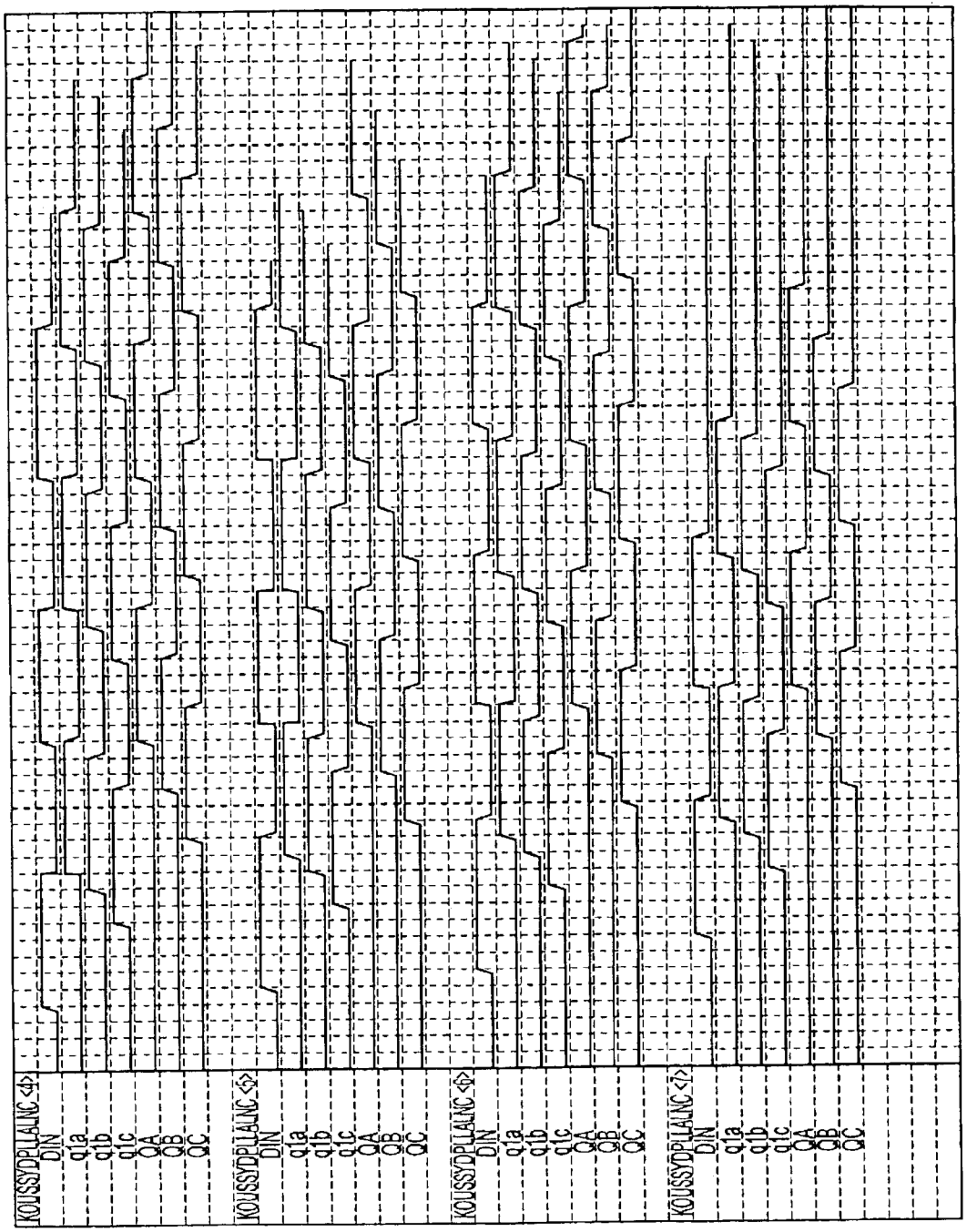

FIG. 17 illustrates an exemplary embodiment of an alignment circuit 521. As shown, each alignment circuit 521 comprises 6 D-type flip-flops 522, which are configured so as to form three rows, each of which comprises two flip-flops. In each of the rows, the first D-type flip-flop receives a data input signal corresponding to the corresponding output signal of the pulse width adjustment circuit 510 coupled to the given alignment circuit 521. The second D-type flip-flop in each row receives the output of the first flip-flop in the row as an input signal. The clock signals applied to each of the six flip-flops are as shown in FIG. 17. The detailed operation of the each alignment circuit is depicted in the exemplary timing diagrams set forth in FIGS. 25f and 25g.

Figure 18:
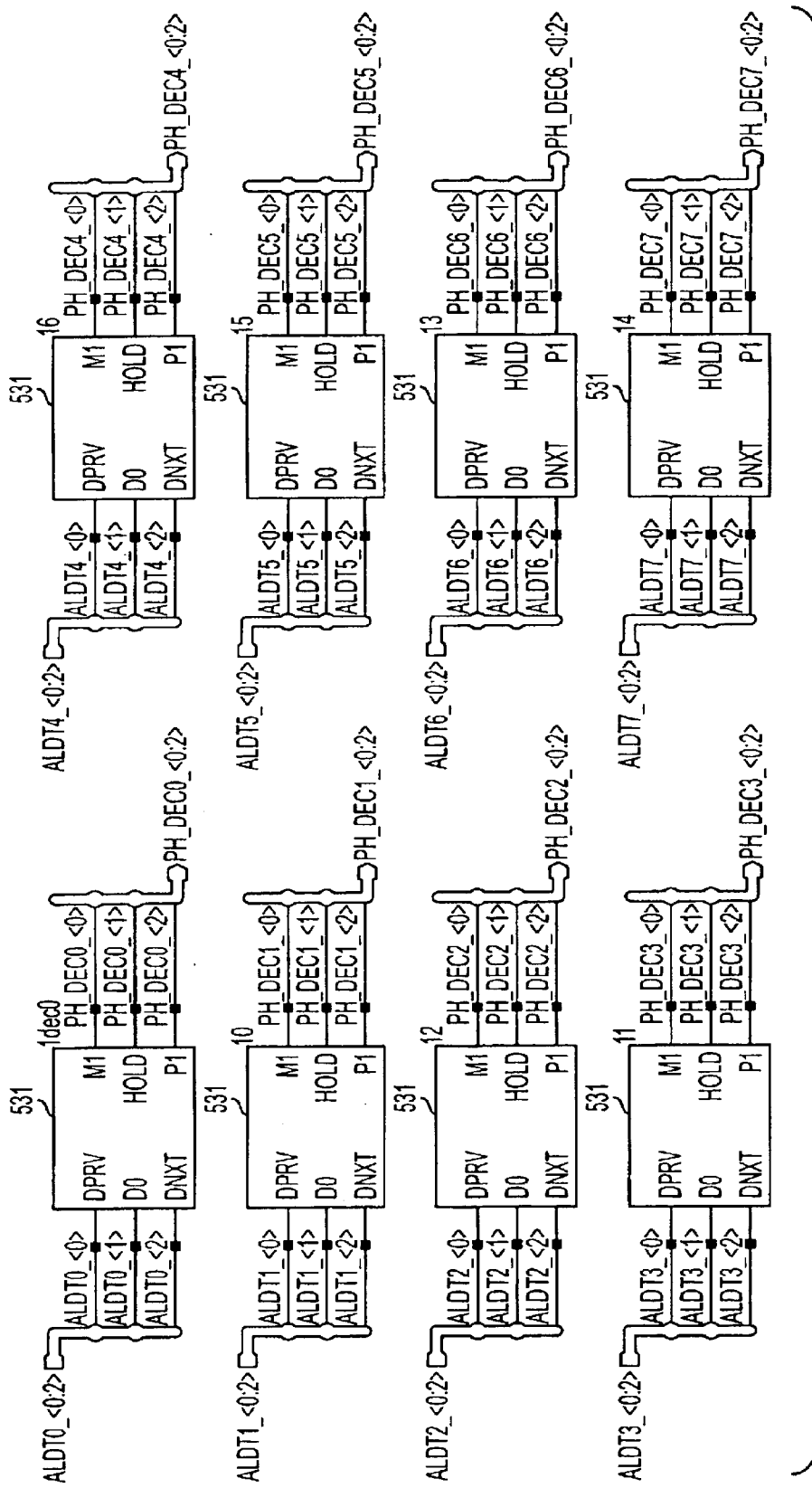
FIG. 18 is an exemplary embodiment of the phase decoder unit utilized in the fourth embodiment of the present invention.
Figure 20:
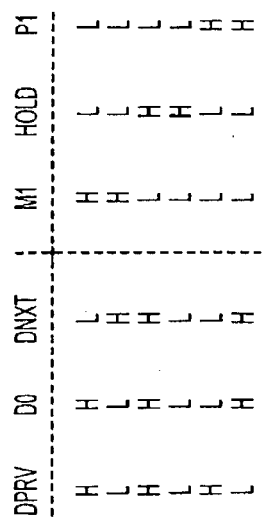
FIG. 20 contains a table illustrating the logical operation preformed by the phase decoder illustrated in FIG. 19.
Figure 19:
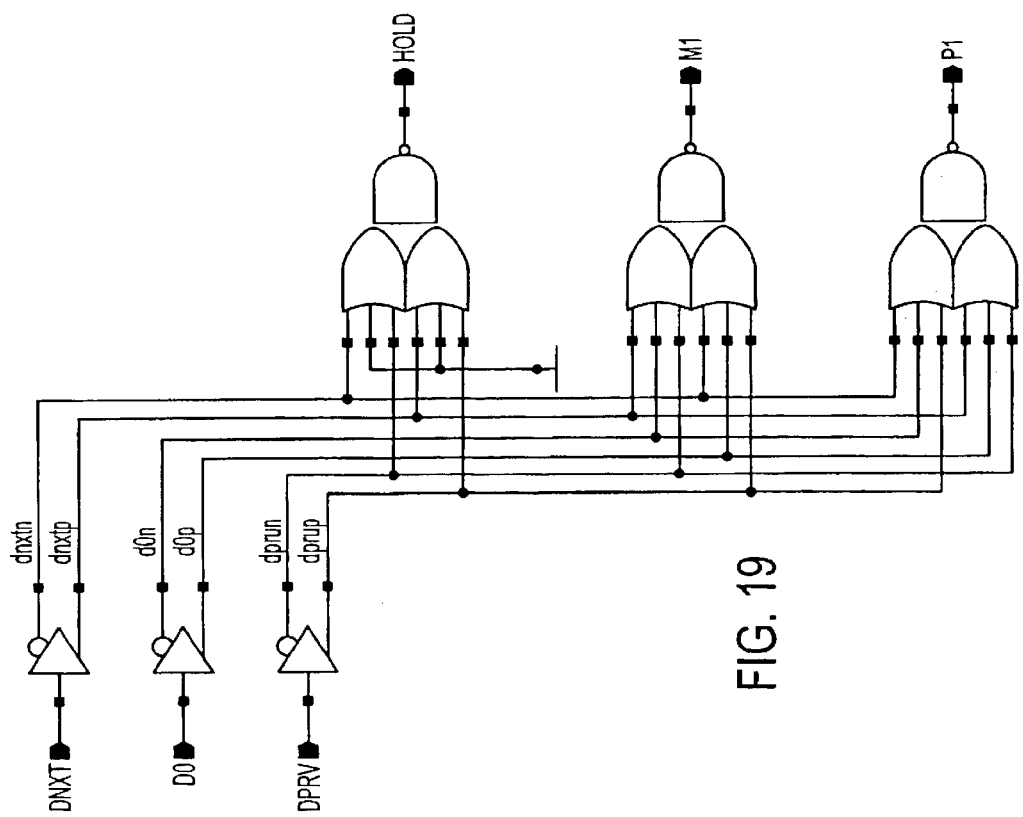
FIG. 19 illustrates an exemplary embodiment of a phase decoder utilized in the phase decoder unit of FIG. 18.

The eight 3-bit outputs of the data alignment unit 520 are coupled to eight corresponding inputs of the phase decoder unit 530. Referring to FIG. 18, which is a detailed exemplary embodiment of the phase decoder unit 530, the phase decoder unit 530 comprises eight identical phase decoders 531. In operation, each phase decoder 531 functions to compare the data samples presented at the input thereof, which are supplied by the alignment unit 520 in the manner illustrated in FIG. 18. FIG. 19 illustrates an exemplary embodiment of one phase decoder 531. As shown, the phase decoder 531 of the fourth embodiment is identical to the phase decoder of the first embodiment. Moreover, the output of each phase decoder 531 is generated in accordance with the table set forth in FIG. 20, which is identical to the table illustrated FIG. 6. Accordingly, each of the phase decoders 531 and the overall operation of the phase decoder unit 530 is substantially the same as the corresponding units described above in conjunction with the second embodiment. The result of the operation of the phase decoder unit 530 based on the exemplary data utilized in the timing diagrams shown in FIG. 25a is depicted in the timing diagrams set forth in FIG. 25b.

Figure 22:
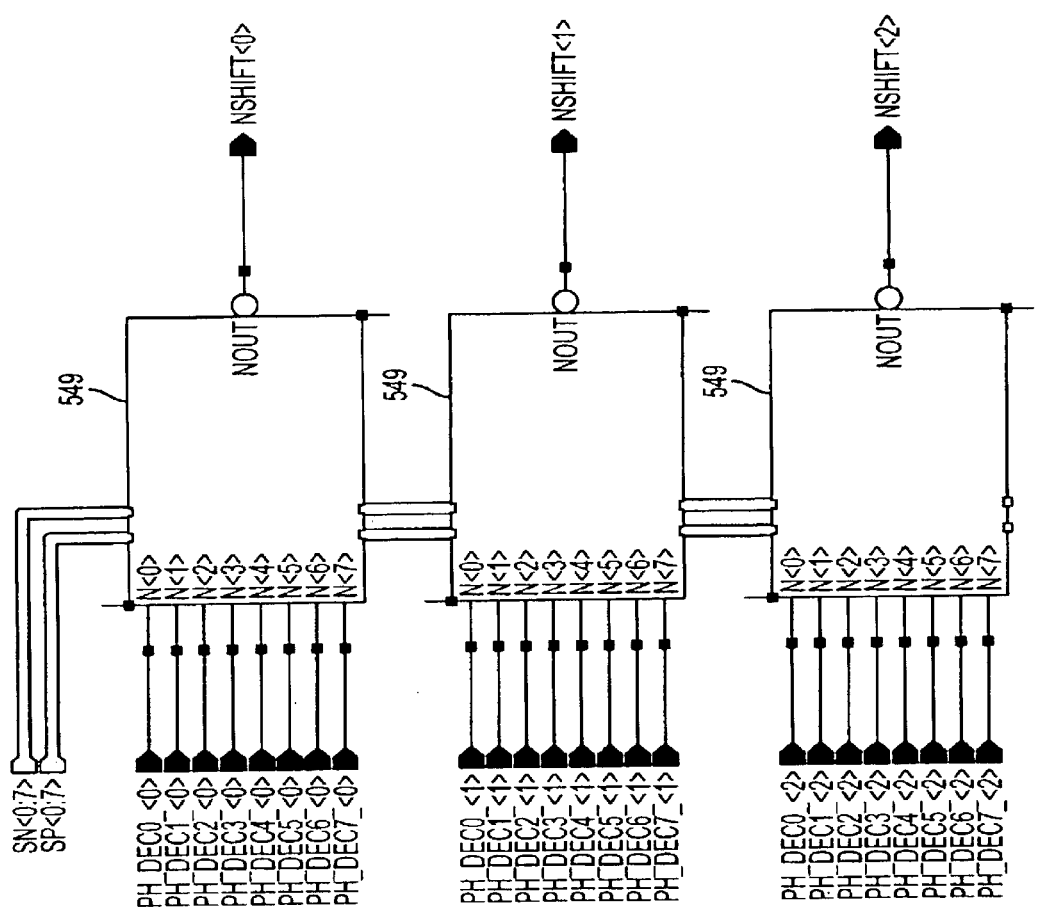
FIG. 22 is an exemplary embodiment of the multiplexer 541t utilized in the fourth embodiment of the present invention.

The outputs of each of the eight phase decoders are coupled to corresponding inputs of multiplexer 541 of multiplexer unit 540. FIG. 22 illustrates an exemplary embodiment of the multiplexer 541. As shown, the multiplexer 541 comprises three separate 8:1 multiplexers 549, each of which receives a single bit of the three bit outputs generated by each of the phase decoders 531. The output of each of the three multiplexers 549 form the 3-bit output of the multiplexer 541, which is coupled to the input of the barrel shifter 560.

Figure 21A:
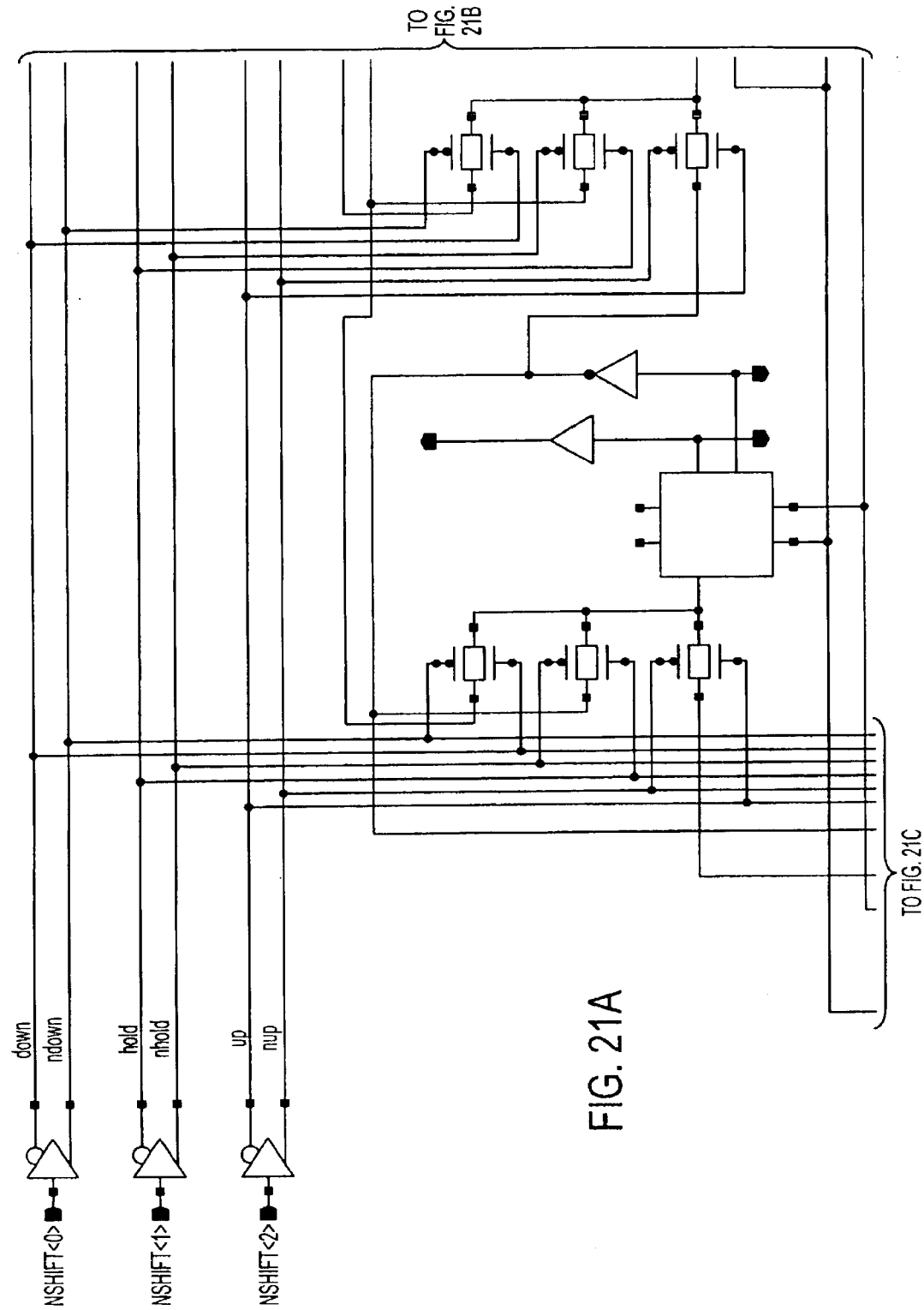
FIG. 21 is an exemplary embodiment of the barrel shifter unit utilized in the fourth embodiment of the present invention.
Figure 21C:
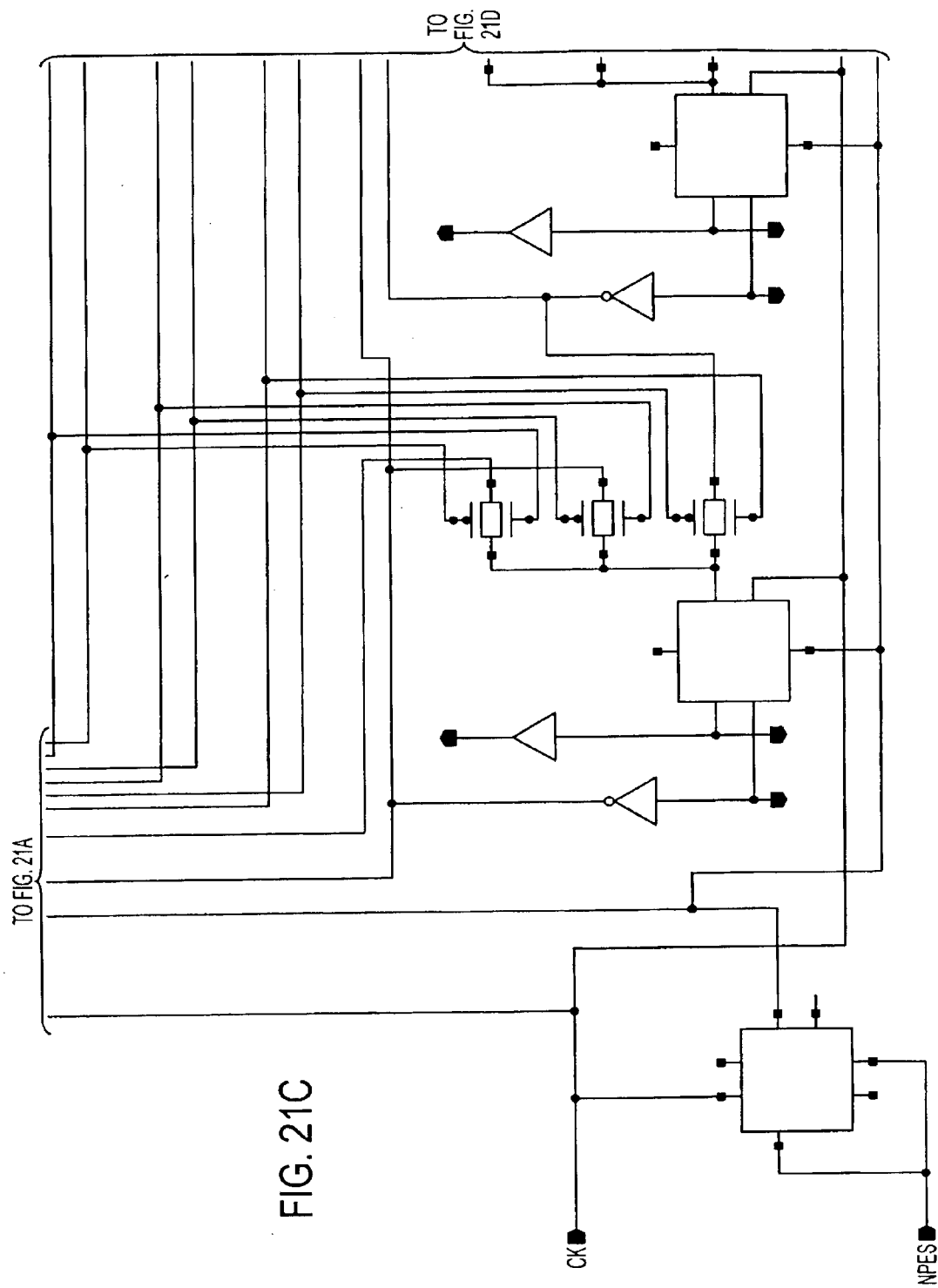

Similar to the operation of the second embodiment, the multiplexer unit 540 determines which of the eight decoded output signals generated by the phase decoder unit 530 are coupled to the barrel shifter unit 560. Moreover, as also with the second embodiment, the multiplexer unit 540 and the barrel shifter unit 560 form a feedback loop, whereby the output of the barrel shifter unit 560 operates to control the decoded output signal coupled to the barrel shifter unit 560. A detailed exemplary embodiment of the barrel shifter unit 560 of the fourth embodiment is illustrated in FIG. 21. As shown in FIG. 21, the barrel shifter unit 560 is substantially identical to the barrel shifter illustrated in FIG. 8, with the exception being that instead of providing for the monitoring of sampling results at four distinct intervals, the barrel shifter unit 560 provides for the monitoring of sampling results at eight distinct intervals.

The multiplexer unit 540 of the fourth embodiment further comprises an additional three 8:1 multiplexers 542, 543 and 544. Multiplexer 542 receives the middle sampled data point of each of the eight 3-bit output signals generated by the data alignment unit 520. The output of multiplexer 542, which is controlled by the barrel shifter 560, is coupled to a latch 545 and represents the recovered data signal, RD. As shown, latch 545 is clocked by the recovered clock signal "CK" so as to synchronize the recovered clock signal with the recovered data signal. In operation, the data sample utilized in the recovered data signal at a given point in time corresponds to middle sample of the current samples selected by the barrel shifter unit 560.

Figure 23:
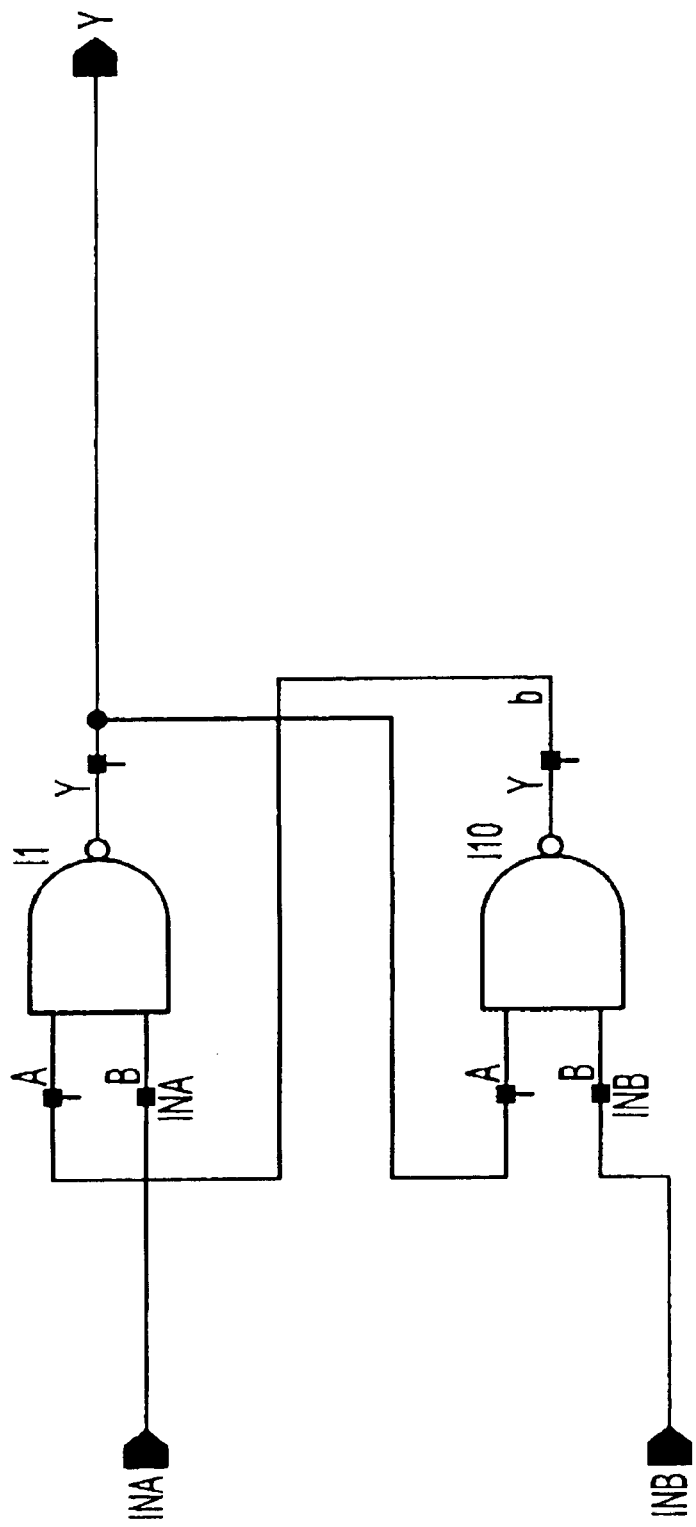
FIG. 23 is an exemplary embodiment of a latch circuit utilized in the fourth embodiment of the present invention.

In a similar fashion, multiplexers 543 and 544 receive clock signals mck <0:7> at their respective input lines. It is noted that the while the input clock samples mck <0:7> correspond to multiplexer inputs n<0:7> for multiplexer 543, for multiplexer 544, the input clock samples are shifted such that mck <1> is input to N <0>, and mck <2> is input to N <1>, and so on. The outputs of multiplexers 543 and 544 are coupled to circuit 556, which functions to prevent errors from being generated as the selected clock signal changes between the various clock samples. A detailed exemplary embodiment of circuit 556 is illustrated in FIG. 23.

The outputs of multiplexers 543 and 544, which are also controlled by the barrel shifter unit 560, determine the output of circuit 556, which represents the recovered clock signal. As shown, the recovered clock signal is utilized to clock both the barrel shifter 560 and the latch 545.

Similar to the operation of the first embodiment, depending on the value of the signals of the selected decoded signal currently coupled to the barrel shifter unit 560, the barrel shifter unit 560 adjusts the samples to be considered and the selected clock signal either forward or backward. More specifically, if the Nshift <0> input of the barrel shifter unit 560 is logical high, the barrel shifter unit 560 functions to decrement the selected samples, and therefore the selected clock signal. For example, if the samples currently being considered corresponded to PH_DEC1 and the clock signal being utilized was mck1, they would be decremented to PH_DEC0 and mck0, respectively. In the event the Nshift <1> input of the barrel shifter unit 560 is logical high, the barrel shifter unit 560 functions to maintain the current samples, and the currently selected clock signal Finally, in the event the Nshift <2> input of the barrel shifter unit 560 is logical high, the barrel shifter unit 560 functions to increment the selected samples, and the selected clock signal. For example, if the samples currently being considered corresponded to PH_DEC1 and the clock signal being utilized was mck1, they would be incremented to PH_DEC2 and mck2, respectively. This process continues throughout the operation of the system.

Figure 24B:
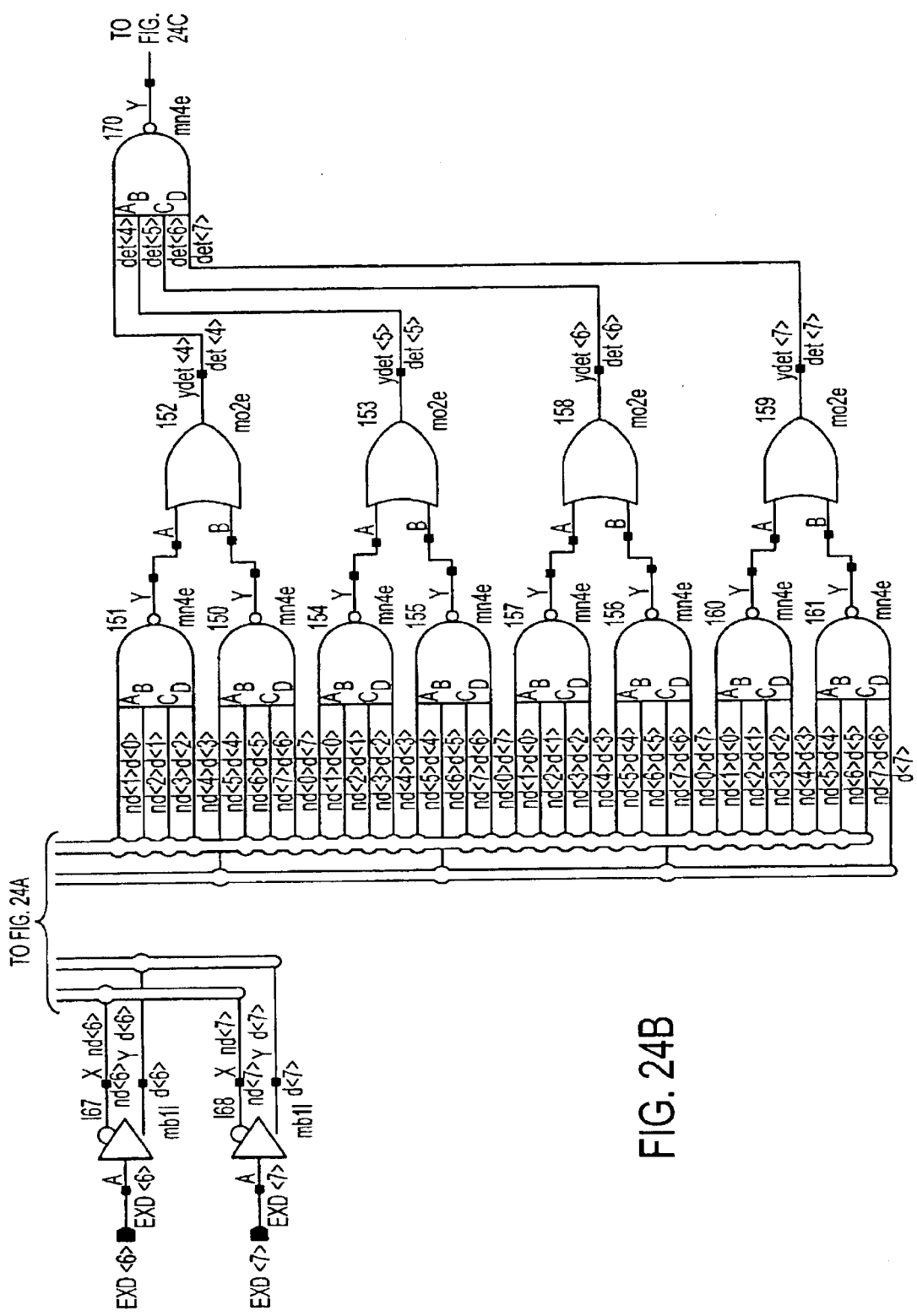
FIG. 24 illustrates an exemplary embodiment of an error detection circuit utilized in the fourth embodiment of the present invention
Figure 24C:
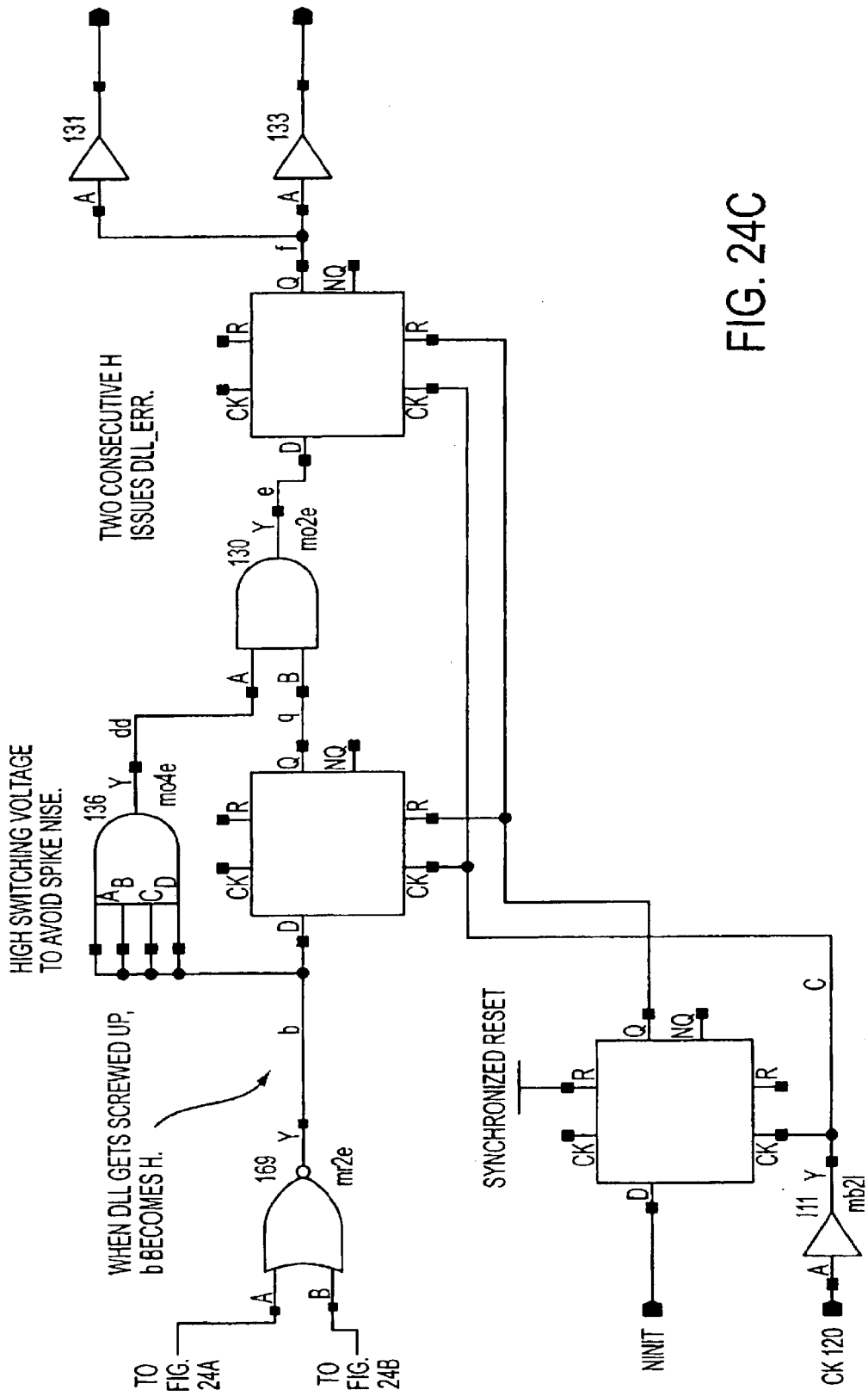

Finally, the fourth embodiment of the present invention further comprises an error detector circuit illustrated in FIG. 24. It is noted that the embodiment of the error detector circuit illustrated in FIG. 24 is merely exemplary in nature and is not intended to be limiting. In operation, the error detector circuit operates to monitor the outputs of the 8 flip-flops contained in the barrel shifter unit 560. In accordance with proper operation of the barrel shifter, only one of the 8 outputs should be high at a given time. The error detector circuit operates to monitor these 8 outputs and initiate a system reset in the event that two or more of the 8 outputs are simultaneously high.

While specific details various embodiments of the clock recovery system of the present have been disclosed herein, it is also clear that other variations are possible. For example, it would be understood that an alternative logic designs for implementing the phase decoder and barrel shifter are possible. In addition, latches or than d-type flip-flops can also be utilized. Clearly, other variations of the specific embodiments disclosed herein are also possible.

As described above, the clock recovery system of the present invention provides significant advantages over the prior art. Most importantly, the clock recovery system of the present invention provides a simple and cost effective design for the generation of a clock signal corresponding to an asynchronous data signal that minimizes the amount of data lost during the synchronization process. In addition, the system of the present invention does not require the over-sampling of the incoming asynchronous data signal. As a result, the present invention eliminates the cost and noise problems associated with the inclusion of an additional oscillator. Furthermore, as oversampling is not necessary, there are no constraints on the maximum allowable data rate.

Although certain specific embodiments of the present invention have been disclosed, it is noted that the present invention may be embodied in other forms without departing from the spirit or essential characteristics thereof. The present embodiments are therefor to be considered in all respects as illustrative and not restrictive, the scope of the invention being indicated by the appended claims, and all changes that come within the meaning and range of equivalency of the claims are therefore intended to be embraced therein.

I claim:

1. A clock recovery system for generating a clock signal corresponding to an asynchronous data signal, said circuit comprising:

an input port for receiving an incoming data signal;

a local oscillator circuit for generating a plurality of clock signals having the same frequency, said plurality of clock signals each being shifted in phase relative to one another;

a sampling unit having a plurality of latches, each of said latches being clocked by one of said plurality of clock signals generated by said local oscillator circuit, said sampling unit outputting a plurality data samples of said incoming data signal;

a data phase alignment unit coupled to said sampling unit, said data phase alignment unit receiving said plurality of said data samples as input signal and operative for shifting the phase of said plurality of data samples;

a multiplexer circuit coupled to said data phase alignment unit, said multiplexer circuit having a first multiplexer operative for selecting a portion of said plurality of said data samples, each of said data samples having a corresponding clock signal, which is one of said plurality of clock signals generated by said local oscillator circuit, said multiplexer circuit having a second multiplexer operative for selecting one of said plurality of clock signals generated by said local oscillator circuit;

a phase decoder coupled to said multiplexer circuit, said phase decoder operative for receiving said portion of said plurality of data samples selected by said multiplexer and for generating an output signal indicative of the logic values of the portion of said plurality of said data samples selected by said first multiplexer; and a barrel shifter circuit coupled to said phase decoder, said barrel shifter operative for adjusting the data samples selected by said first multiplexer in accordance with the output signal of said phase decoder.

2. The clock recovery system according to claim 1, wherein said local oscillator circuit generates four clock signals having the same frequency, each of said four clock signals being out of phase with one another by 90°.

3. The clock recovery system according to claim 2, wherein said clock sampling unit comprises four latches, each of which comprises a d-type flip-flop, and each of which is clock by one of said four clock signals generated by said local oscillator, said sampling unit generating four data samples during one cycle of the local oscillator.

4. The clock recovery system according to claim 3, wherein said data phase alignment unit comprises a plurality of latches, each of which is a d-type flip-flop, said data phase alignment unit operative for aligning the phase of three of the four data samples generated by said sampling unit each cycle of the local oscillator.

5. The clock recovery system according to claim 4, wherein said first multiplexer selects said three data samples aligned in phase and couples said three data samples to said phase detector, said three data samples being contiguous samples, said three data samples having a middle sample which represents a recovered data signal, said second multiplexer selecting and outputting the one of said four clock signals utilized to generate said middle sample selected by said multiplexer, said output of said second multiplexer representing said recovered clock signal.

6. The clock recovery system according to claim 5, further comprising an output latch operative for receiving said middle sample selected by said first multiplexer as an input signal, said output latch being clock by the output signal of said second multiplexer so as to synchronize said recovered data signal and said recovered clock signal.

7. The clock recovery system according to claim 1, wherein said incoming data signal is an asynchronous data signal.

8. A clock recovery system for generating a clock signal corresponding to an asynchronous data signal, said circuit comprising:

an input port for receiving an incoming data signal;

a local oscillator circuit for generating a plurality of clock signals having the same frequency, said plurality of clock signals each being shifted in phase relative to one another;

a sampling unit having a plurality of latches, each of said latches being clocked by one of said plurality of clock signals generated by said local oscillator circuit, said sampling unit outputting a plurality data samples of said incoming data signal;

a data phase alignment unit coupled to said sampling unit, said data phase alignment unit receiving said plurality of said data samples as input signal and operative for shifting the phase of said plurality of data samples;

a phase decoder unit coupled to said data phase alignment unit, said phase decoder operative for receiving plurality of data samples aligned in phase and output by said data phase alignment unit and for generating output signals indicative of the logic values of said plurality of said data samples; and a multiplexer circuit coupled to said phase decoder unit, said multiplexer circuit having a first multiplexer operative for selecting a portion of said plurality of said output signals generated by said phase decoder, said portion of said output signals representing the logical levels of contiguous data samples, each of said data samples having a corresponding clock signal, which is one of said plurality of clock signals generated by said local oscillator circuit, said multiplexer circuit having a second multiplexer operative for selecting one of said data samples, said multiplexer circuit having a third multiplexer operative for selecting one of said plurality of clock signals generated by said local oscillator circuit; and a barrel shifter circuit coupled to said multiplexer, said barrel shifter operative for adjusting the portion of said plurality of output signals generated by said phase decoder selected by said first multiplexer, adjusting the one of said data samples selected by said second multiplexer, and for adjusting the one of said plurality of clock signals generated by said local oscillator circuit selected by said third multiplexer.

9. The clock recovery system according to claim 8, wherein said local oscillator circuit generates four clock signals having the same frequency, each of said four clock signals being out of phase with one another by 90°.

10. The clock recovery system according to claim 9, wherein said sampling unit comprises four latches, each of which comprises a d-type flip-flop, and each of which is clock by one of said four clock signals generated by said local oscillator, said sampling unit generating four data samples during one cycle of the local oscillator.

11. The clock recovery system according to claim 10, wherein said data phase alignment unit comprises a plurality of latches, each of which is a d-type flip-flop, said data phase alignment unit operative for aligning the phase of three of the four data samples generated by said sampling unit each cycle of the local oscillator.

12. The clock recovery system according to claim 8, wherein said incoming data signal is an asynchronous data signal.

13. A method of recovering a clock signal corresponding to a data signal, said method comprising:

receiving an incoming data signal;

generating a plurality of clock signals having the same frequency, said plurality of clock signals each being shifted in phase relative to one another;

sampling said incoming data signal by utilizing a plurality of latches, each of said latches being clocked by one of said plurality of clock signals, and outputting a plurality data samples of said incoming data signal;

aligning the phase of said plurality of data samples;

selecting a portion of said plurality of said data samples, each of said data samples having a corresponding clock signal which is one of said plurality of clock signals, said selected portion of said data samples having a middle sample which represents a recovered data signal, said clock signal corresponding to said middle sample representing said recovered clock signal;

decoding said selected portion of said plurality of said data signals so as to generate an output signal indicative of the logic values of the portion of said plurality of said selected data signals; and adjusting the selected data samples in accordance with said output signal.

14. The method of recovering a clock signal according to claim 13, wherein four clock signals are generated, each of said four clock signals being out of phase with one another by 90°.

15. The method of recovering a clock signal according to claim 13, wherein said incoming data signal is an asynchronous data signal.

16. A clock recovery system for generating a clock signal corresponding to an asynchronous data signal, said circuit comprising:

an input port for receiving an incoming data signal;

a local oscillator circuit for generating a plurality of clock signals having the same frequency, said plurality of clock signals each being shifted in phase relative to one another;

a sampling unit having a plurality of latches, each of said latches being clocked by one of said plurality of clock signals generated by said local oscillator circuit, said sampling unit outputting a plurality data samples of said incoming data signal;

a pulse width adjustment circuit coupled to said sampling unit, said pulse width adjustment circuit operative for extending the pulse width of at least some of the data samples output by said sampling unit;

a data phase alignment unit coupled to said pulse width adjustment circuit, said data phase alignment unit receiving said plurality of said data samples as an input signal and operative for shifting the phase of said plurality of said data samples and outputting aligned data samples;

a phase decoder coupled to said data phase alignment unit, said phase decoder operative for receiving said data samples output by said data phase alignment unit and for generating a plurality of output signals each of which is indicative of the logic values of said data samples, each of said plurality of output signals of said phase decoder having a corresponding clock signal, which is one of said plurality of clock signals generated by said local oscillator circuit;

a multiplexer circuit coupled to said phase decoder, said multiplexer circuit having a first multiplexer operative for selecting one of the plurality of output signals generated by the phase decoder; a second multiplexer operative for selecting one of the data samples output by the data phase alignment unit, and a third multiplexer operative for selecting one of the clock signals generated by the local oscillator circuit; and a barrel shifter circuit coupled to said multiplexer circuit, said barrel shifter operative for adjusting the data samples selected by said first multiplexer in accordance with the output signal of said phase decoder.

17. The clock recovery system according to claim 16, wherein said local oscillator circuit generates eight clock signals having the same frequency, each of said eight clock signals being out of phase with one another by 45°.

18. The clock recovery system according to claim 17, wherein said sampling unit comprises eight latches, each of which comprises a d-type flip-flop, and each of which is clocked by one of said eight clock signals generated by said local oscillator, said sampling unit generating eight data samples during one cycle of the local oscillator.

19. The clock recovery system according to claim 18, wherein said data phase alignment unit comprises a plurality of latches, each of which comprises a d-type flip-flop circuit, said data phase alignment unit operative for aligning the phase of three of the eight data samples associated with one of said eight clock signals and generated by said sampling unit each cycle of the local oscillator.

20. The clock recovery system according to claim 16, wherein said incoming data signal is an asynchronous data signal.

21. The clock recovery system according to claim 17, wherein said pulse width adjustment circuit operates to extend the pulse width of the incoming data signal by 3/8 of a clock cycle when said data sample received from said sampling unit is present for only 4/8 of the entire clock cycle.

22. The clock recovery system according to claim 17, wherein said pulse width adjustment circuit operates to extend the pulse width of the incoming data signal by 2/8 of a clock cycle when said data sample received from said sampling unit is present for only 5/8 of the entire clock cycle.

23. The clock recovery system according to claim 17, wherein said pulse width adjustment circuit operates to extend the pulse width of the incoming data signal by 1/8 of a clock cycle when said data sample received from said sampling unit is present for only 6/8 of the entire clock cycle.

24. The clock recovery system according to claim 17, wherein said pulse width adjustment circuit operates not to extend the pulse width of the incoming data signal when said data sample received from said sampling unit is present for 1/8, 2/8 3/8 or 8/8 of the entire clock cycle.

25. A method of recovering a clock signal corresponding to a data signal, said method comprising:

receiving an incoming data signal;

generating a plurality of clock signals having the same frequency, said plurality of clock signals each being shifted in phase relative to one another;

sampling said incoming data signal by utilizing a plurality of latches, each of said latches being clocked by one of said plurality of clock signals, and outputting a plurality data samples of said incoming data signal;

adjusting the pulse width of at least some of the data samples output by said sampling unit;

aligning the phase of said plurality of data samples;

selecting a portion of said plurality of said data samples, each of said data samples having a corresponding clock signal which is one of said plurality of clock signals, said selected portion of said data samples having a middle sample which represents a recovered data signal, said clock signal corresponding to said middle sample representing said recovered clock signal;

decoding said selected portion of said plurality of said data signals so as to generate an output signal indicative of the logic values of the portion of said plurality of said selected data signals; and adjusting the selected data samples in accordance with said output signal.

26. The method of recovering a clock signal according to claim 25, wherein eight clock signals are generated, each of said eight clock signals being out of phase with one another by 45°.

27. The method of recovering a clock signal according to claim 25, wherein said incoming data signal is an asynchronous data signal.

28. The method of recovering a clock signal according to claim 26, wherein said pulse width of the incoming data signal is extended by 2/8 of a clock cycle when said data sample received from said sampling unit is present for only 5/8 of the entire clock cycle.

29. The method of recovering a clock signal according to claim 26, wherein said pulse width of the incoming data signal is extended by 1/8 of a clock cycle when said data sample received from said sampling unit is present for only 6/8 of the entire clock cycle.

30. The method of recovering a clock signal according to claim 26, wherein said pulse width of the incoming data signal is not extended when said data sample received from said sampling unit is present for 1/8, 2/8/ 3/8 or 8/8 of an entire clock cycle.

31. A clock recovery system for generating a clock signal corresponding to an asynchronous data signal, said circuit comprising:

means for receiving an incoming data signal;

means for generating a plurality of clock signals having the same frequency, said plurality of clock signals each being shifted in phase relative to one another;

means for sampling said incoming data signal by utilizing a plurality of latches, each of said latches being clocked by one of said plurality of clock signals, and outputting a plurality data samples of said incoming data signal;

means for adjusting the pulse width of at least some of the data samples output by said sampling unit;

means for aligning the phase of said plurality of data samples;

means for selecting a portion of said plurality of said data samples, each of said data samples having a corresponding clock signal which is one of said plurality of clock signals, said selected portion of said data samples having a middle sample which represents a recovered data signal, said clock signal corresponding to said middle sample representing said recovered clock signal;

means for decoding said selected portion of said plurality of said data signals so as to generate an output signal indicative of the logic values of the portion of said plurality of said selected data signals; and means for adjusting the selected data samples in accordance with said output signal.

32. The clock recovery system for generating a clock signal corresponding to an asynchronous data signal according to claim 31, wherein said incoming data signal is an asynchronous data signal.

33. The clock recovery system according to claim 31, wherein said means for adjusting the pulse width of the incoming data signal operates to adjust the pulse width by 3/8 of a clock cycle when said data sample received from said sampling unit is present for only 4/8 of the entire clock cycle.

34. The clock recovery system according to claim 31, wherein said means for adjusting the pulse width of the incoming data signal operates to adjust the pulse width by 2/8 of a clock cycle when said data sample received from said sampling unit is present for only 5/8 of the entire clock cycle.

35. The clock recovery system according to claim 31, wherein said means for adjusting the pulse width of the incoming data signal operates to adjust the pulse width by 1/8 of a clock cycle when said data sample received from said sampling unit is present for only 6/8 of the entire clock cycle.

36. The clock recovery system according to claim 31, wherein said means for adjusting the pulse width of the incoming data signal does not extend the pulse width of the incoming data signal when said data sample received from said sampling unit is present for 1/8, 2/8/ 3/8 or 8/8 of the entire clock cycle.

* * * * *